(12) United States Patent
Magno

(10) Patent No.: US 11,016,128 B2
(45) Date of Patent: May 25, 2021

(54) METHOD AND APPARATUS FOR ELECTRICAL LINE TESTING

(71) Applicant: Jeff R. Magno, Kenosha, WI (US)

(72) Inventor: Jeff R. Magno, Kenosha, WI (US)

( * ) Notice: Subject to any disclaimer, the term of this patent is extended or adjusted under 35 U.S.C. 154(b) by 422 days.

(21) Appl. No.: 15/835,508

(22) Filed: Dec. 8, 2017

(65) Prior Publication Data

US 2019/0178919 A1 Jun. 13, 2019

(51) Int. Cl.

| | |
|---|---|
| *G01R 19/15* | (2006.01) |
| *G08B 7/06* | (2006.01) |
| *G08B 29/06* | (2006.01) |
| *G08B 5/36* | (2006.01) |
| *G08B 21/18* | (2006.01) |
| *G08B 25/10* | (2006.01) |

(52) U.S. Cl.
CPC .............. *G01R 19/15* (2013.01); *G08B 5/36* (2013.01); *G08B 7/06* (2013.01); *G08B 21/185* (2013.01); *G08B 25/10* (2013.01); *G08B 29/06* (2013.01)

(58) Field of Classification Search
CPC .... G01R 19/15; G01R 31/3277; G01R 31/50; G01R 19/145; G01R 19/16547; G01R 31/52; G01R 31/67; G01R 31/086; G01R 31/58; G01R 19/155; G01R 31/54; G01R 31/60; G01R 31/69; G01R 15/125; G01R 19/2513; G01R 31/3272; G01R 31/66; G01R 15/04; G01R 19/0084; G01R 19/2516; G01R 1/025; G01R 1/0408; G01R 1/06788; G01R 1/07; G01R 1/22; G01R 27/16; G01R 31/12; G01R 31/1272; G01R 31/3333; G01R 31/42; G01R 31/44; G01R 31/74; G08B 29/06; G08B 5/36; G08B 21/185; G08B 25/10; G08B 7/06; H02H 1/0015; H02H 3/044; H02H 3/335; H02H 3/006; H02H 3/04; H02H 3/042; H02H 3/331; H02H 3/44; H02H 7/22; H02H 7/26; H02H 7/263; H02H 9/04; H02H 9/06
See application file for complete search history.

(56) References Cited

U.S. PATENT DOCUMENTS

| | | |
|---|---|---|
| 3,962,630 A | 6/1976 | Chaffee |
| 4,015,201 A | 3/1977 | Chaffee |
| 4,027,236 A | 5/1977 | Stewart |
| 4,051,333 A | 9/1977 | Schomberg |
| 4,074,187 A | 2/1978 | Miller et al. |
| 4,160,206 A | 7/1979 | Bojarski |

(Continued)

FOREIGN PATENT DOCUMENTS

WO WO2001077698 A2 10/2001

*Primary Examiner* — Lee E Rodak

(74) *Attorney, Agent, or Firm* — Lesavich High-Tech Law Group, S.C.; Stephen Lesavich

(57) ABSTRACT

A method and apparatus for electrical line testing. The method and apparatus provides audio, visual and/or electronic information to indicate electricity is flowing or not flowing through an electrical circuit controlled by a remote circuit breaker. The method and system help identify which electrical sockets are controlled by which remote circuit breakers. The method and apparatus is used over short distances in a residential home or over long distances in a commercial building such as a warehouse or factory. The method and apparatus is used with or without an external network devices such as a smartphone, electronic tablet, wearable device, etc.

17 Claims, 11 Drawing Sheets

(56) References Cited

U.S. PATENT DOCUMENTS

| | | |
|---|---|---|
| 4,207,517 A | 6/1980 | Bloxam |
| 4,225,817 A | 9/1980 | Kahlden |
| 4,258,968 A | 3/1981 | Holt |
| 4,642,556 A * | 2/1987 | Pecukonis ............... G01R 31/67 324/67 |
| 4,713,653 A | 12/1987 | McDermott |
| 4,736,197 A | 4/1988 | Buyak et al. |
| 4,791,376 A | 12/1988 | Freedman et al. |
| 4,857,826 A | 8/1989 | Graham |
| 4,945,346 A | 7/1990 | Schmiemann |
| 4,950,997 A | 8/1990 | Austin et al. |
| 4,999,574 A | 3/1991 | Stephens |
| 5,043,670 A | 8/1991 | Isfeld et al. |
| 5,218,616 A | 6/1993 | Stephens |
| 5,319,306 A | 6/1994 | Schuyler |
| 5,387,872 A * | 2/1995 | Nightingale ....... G01R 1/06738 324/538 |
| 5,493,206 A * | 2/1996 | Boons ...................... H02G 1/00 324/527 |
| D375,905 S | 11/1996 | Kittridge |
| 5,608,337 A | 3/1997 | Hendricks et al. |
| 5,672,964 A | 9/1997 | Vinci |
| 5,877,618 A | 3/1999 | Luebke |
| 6,020,822 A | 2/2000 | Marshall |
| D422,518 S | 4/2000 | Luebke |
| D425,803 S | 5/2000 | Luebke et al. |
| 6,496,022 B1 | 12/2002 | Kash et al. |
| 6,515,304 B1 | 2/2003 | Kash et al. |
| 6,698,381 B2 | 3/2004 | Lynch |
| 6,967,445 B1 | 11/2005 | Jewell et al. |
| 6,977,493 B2 | 12/2005 | Novak et al. |
| 7,068,038 B2 | 6/2006 | Mason et al. |
| 7,091,723 B2 * | 8/2006 | Simmons ........... G01R 31/3277 324/508 |
| 7,115,912 B2 | 10/2006 | Kash et al. |
| 7,259,567 B2 | 8/2007 | Sears et al. |
| 7,375,533 B2 | 5/2008 | Gale |
| 7,399,992 B2 | 7/2008 | Kash et al. |
| 7,612,382 B2 | 11/2009 | Kash et al. |
| 7,781,782 B2 | 8/2010 | Kash et al. |
| 7,791,086 B2 | 9/2010 | Kash et al. |
| 7,791,087 B2 | 9/2010 | Kash et al. |
| 7,830,154 B2 | 11/2010 | Gale |
| 7,859,420 B2 | 12/2010 | Hamilton et al. |
| 7,944,212 B2 | 5/2011 | Radle et al. |
| 8,463,765 B2 | 6/2013 | Lesavich |
| 8,493,060 B1 | 7/2013 | Mahoney |
| 8,866,485 B1 * | 10/2014 | Lacey .................... G01R 31/69 324/508 |
| 9,037,564 B2 | 5/2015 | Lesavich et al. |
| 9,121,870 B2 | 9/2015 | Nguyen et al. |
| 9,137,250 B2 | 9/2015 | Lesavich et al. |
| 9,229,060 B1 | 1/2016 | Mahoney |
| 9,354,256 B1 | 5/2016 | Mahoney |
| 9,361,479 B2 | 6/2016 | Lesavich et al. |
| D762,502 S * | 8/2016 | Shen ........................... D10/79 |
| 9,569,771 B2 | 2/2017 | Lesavich et al. |
| 2003/0132753 A1* | 7/2003 | Lavoie ................ G01R 31/327 324/424 |
| 2004/0174173 A1* | 9/2004 | Elms ...................... G01R 31/50 324/509 |
| 2004/0224148 A1 | 11/2004 | Matsunaga |
| 2005/0176286 A1 | 8/2005 | Waldschmidt |
| 2005/0212526 A1* | 9/2005 | Blades .................. G01R 31/67 324/543 |
| 2006/0103390 A1 | 5/2006 | Simmons et al. |
| 2006/0192577 A1 | 8/2006 | Matsunaga |
| 2007/0090850 A1 | 4/2007 | Miller et al. |
| 2007/0224089 A1 | 9/2007 | Logan |
| 2008/0061813 A1 | 3/2008 | Miller et al. |
| 2009/0189625 A1 | 7/2009 | Taunton |
| 2009/0212964 A1* | 8/2009 | Hibma ............. G01R 19/16547 340/657 |
| 2011/0208710 A1 | 8/2011 | Lesavich |
| 2012/0268136 A1* | 10/2012 | Lee ........................ G01R 31/66 324/508 |
| 2012/0278622 A1 | 11/2012 | Lesavich et al. |
| 2013/0239335 A1 | 9/2013 | Anderson et al. |
| 2014/0189792 A1 | 7/2014 | Lesavich et al. |
| 2014/0266287 A1* | 9/2014 | Reeder, III .......... G01R 1/0408 324/759.01 |
| 2015/0185251 A1* | 7/2015 | Heydron ................ G01R 15/12 324/754.02 |
| 2015/0233690 A1 | 8/2015 | Hayes et al. |
| 2015/0241475 A1 | 8/2015 | Anderson et al. |
| 2015/0379301 A1 | 12/2015 | Lesavich et al. |
| 2016/0274168 A1* | 9/2016 | Cabot .................... G01R 31/52 |
| 2016/0321654 A1 | 11/2016 | Lesavich et al. |
| 2016/0327601 A1 | 11/2016 | Brockman et al. |

\* cited by examiner

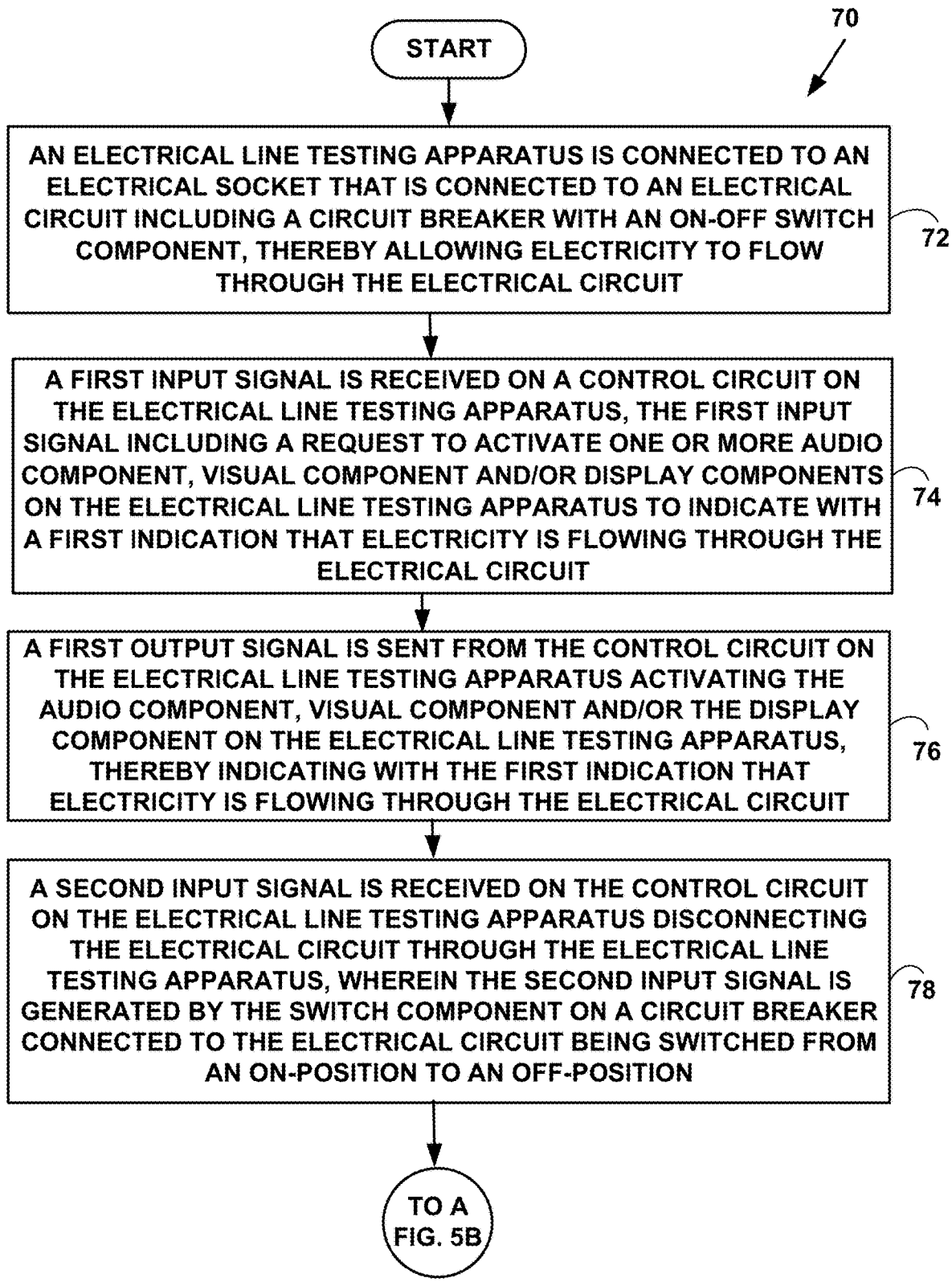

FIG. 5B

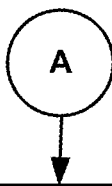

A SECOND OUTPUT SIGNAL IS SENT FROM THE CONTROL CIRCUIT ON THE ELECTRICAL LINE TESTING APPARATUS DEACTIVATING THE ONE OR MORE AUDIO, VISUAL AND/OR THE DISPLAY COMPONENTS ON THE ELECTRICAL LINE TESTING APPARATUS, THEREBY PROVIDING A SECOND INDICATION WITH AUDIO, VISUAL AND/OR ELECTRONIC INFORMATION INDICATION THAT THE CIRCUIT BREAKER CONNECTED TO THE ELECTRICAL CIRCUIT CONTROLS A FLOW OF ELECTRICITY THROUGH THE ELECTRICAL SOCKET AND THAT THE CIRCUIT BREAKER HAS TURNED THE FLOW OF ELECTRICITY TO THE ELECTRICAL SOCKET OFF — 80

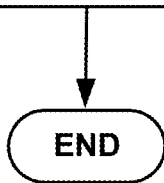

FIG. 6A

```
START
  ↓
```

82

84 — AN ELECTRICAL LINE TESTING APPARATUS IS CONNECTED TO AN ELECTRICAL SOCKET THAT IS CONNECTED TO AN ELECTRICAL CIRCUIT INCLUDING A CIRCUIT BREAKER WITH AN ON-OFF SWITCH COMPONENT, THEREBY ALLOWING ELECTRICITY TO FLOW THROUGH THE ELECTRICAL CIRCUIT

86 — A FIRST INPUT SIGNAL IS RECEIVED ON A CIRCUIT TESTING APPLICATION ON A CONTROL CIRCUIT ON THE ELECTRICAL LINE TESTING APPARATUS, THE FIRST INPUT SIGNAL INCLUDING A REQUEST TO SEND A FIRST MESSAGE TO AN APPLICATION ON A NETWORK DEVICE WITH ONE OR MORE PROCESSORS TO INDICATE THAT ELECTRICITY IS FLOWING THROUGH THE ELECTRICAL CIRCUIT

88 — THE FIRST MESSAGE IS SECURELY SENT FROM THE CIRCUIT TESTING APPLICATION ON THE CONTROL CIRCUIT VIA A WIRELESS INTERFACE ON THE ELECTRICAL LINE TESTING APPARATUS VIA A WIRELESS COMMUNICATIONS NETWORK TO THE APPLICATION ON THE NETWORK DEVICE, THEREBY INDICATING WITH A FIRST INDICATION THAT ELECTRICITY IS FLOWING THROUGH THE ELECTRICAL CIRCUIT. THE FIRST MESSAGE CAUSES THE APPLICATION ON THE NETWORK DEVICE TO ACTIVATE ONE OR MORE AUDIO, VISUAL AND/OR ELECTRONIC INFORMATION DISPLAY COMPONENTS ON THE NETWORK DEVICE

90 — A SECOND INPUT SIGNAL IS RECEIVED ON THE CONTROL CIRCUIT ON THE ELECTRICAL LINE TESTING APPARATUS DISCONNECTING THE ELECTRICAL CIRCUIT THROUGH THE ELECTRICAL LINE TESTING APPARATUS. THE SECOND INPUT SIGNAL IS GENERATED BY THE SWITCH COMPONENT ON A CIRCUIT BREAKER CONNECTED TO THE ELECTRICAL CIRCUIT BEING SWITCHED FROM AN ON-POSITION TO AN OFF-POSITION

TO A FIG. 6B

METHOD AND APPARATUS FOR ELECTRICAL LINE TESTING

FIELD OF INVENTION

This application relates to testing electrical power line testing and electrical circuit testing. More specifically, it relates to a method and apparatus for electrical line testing.

BACKGROUND OF THE INVENTION

Working with electricity is inherently dangerous. When it is time to install a new electrical outlet or complete maintenance tasks on an electrical line, a source of electricity in an electrical line must be turned off.

There are a number of problems associated with turning off the source of electricity for an electrical line. One problem is that several electrical sockets are often connected to the same circuit break or fuse box. Another problem is that an electrical socket is often remotely displaced from a circuit breaker panel or fuse box. The distance makes it difficult to coordinate turning off an electrical source at a circuit breaker panel and keeping a desired electrical socket in view. This problem is more difficult to deal with then electrical sockets are being tested or maintained in a large space such as a warehouse or factory where there are large distances between electrical sockets and a circuit breaker panel or fuse box.

There have been a number of attempts to solve the problems associated with testing electrical lines. For example, U.S. Pat. No. 3,962,630, that issued to Chaffee teaches "A circuit testing device comprises A. multiple probes at least one of which is sized for insertion into a single electrical socket receptacle to test for the presence of voltage, and two of which are applicable to spaced conductive elements to test for electrical continuity there between externally of said device, B. detection means operatively connected with said probes and including indicator means to indicate the presence or absence of voltage when said one probe is inserted into said socket single receptacle, and to indicate the presence or absence of electrical continuity when said two probes are applied to said spaced conductive elements."

U.S. Pat. No. 4,015,201, that issued to Chaffee teaches "A circuit testing device includes a casing, two probes one of which projects from the casing, a voltage level testing circuit operatively connected with one probe and incorporating simple and advantageous circuitry including transistor amplifier means and indicator means, and an electrical continuity testing circuit connected between both the probes."

U.S. Pat. No. 4,027,326, that issued to Stewart teaches "A portable test instrument for testing electrical continuity, and diode polarity, AC and DC voltage amplitudes and DC voltage polarity. An electronic switch device has main electrodes connected in an indicating circuit with an electrical supply, a light-emitting diode and a current-limiting resistor. A double pole, double throw switch is manually switchable between continuity and voltage test positions, and with four resistors defines an input circuit interposed between the control electrode of the electronic switch device and probes connectible to a circuit or the like to be tested. In both the voltage and continuity test modes of the instrument, the light-emitting diode is energized only by current from the electrical supply within the indicating circuit. Though proper circuit operation is obtained by manual manipulation of the mode switch between its voltage and continuity positions, the light-emitting diode is automatically protected from damage should the test probes engage a voltage circuit (within the operating voltage range of the instrument) while the instrument is in continuity mode."

U.S. Pat. No. 4,160,206, that issued to Bojarski teaches "An audible voltage-impedance tester for generating distinct sounds when its test probes are connected across an unknown source, be it a resistive source, a DC voltage source, an AC voltage source or combination thereof. No switching is required between resistive testing and voltage testing nor between DC voltage testing and AC voltage testing. The tester is able to generate distinct sounds for different resistance values, for different DC voltage amplitudes, for different AC voltages with the same frequency but different amplitudes, and for AC voltages with different frequencies but the same amplitudes. A visual indicator of the audible sound is disclosed along with circuitry that utilizes a multi-vibrator whose powered operation by a battery is not affected by the unknown source."

U.S. Pat. No. 4,791,376, that issued to Freedman, et al. teaches "A circuit testing device, including a casing having opposite ends, a single probe rigidly projecting from one end of the casing so that the casing may be manipulated to forcibly insert the probe into an electrical power socket, the casing carrying a first socket terminal, and there being a second probe connected with the socket terminal, circuitry in the casing including at least one Zener diode and at least one half wave rectifier interconnecting the single probe and the socket terminal, a presence-of-voltage circuit in the casing and electrically connected with the single probe, the circuit including a presence of voltage indicator and rectifier and amplifier elements electrically connected between the single probe and the indicator, the rectifier element including a rectifier bridge having two terminals connected across the Zener diode, there also being a voltage level indicating meter connected in series with such circuitry."

U.S. Pat. No. 5,319,306, that issued to Schuyler teaches "A compact, hand-held electrical line tester includes a normally-open relay switch which is closed by connection of its relay portion to a line of a predetermined voltage level, and a piezoelectric tone generator, connected in series with the relay switch and a battery, which emits an audible sound to indicate that the tested line is electrified with the predetermined voltage level. The tester circuit can include a plurality of relay switches and/or tone generators for emitting different sounds in response to different line voltages, so that the user can determine the line voltage(s) without having to check a light indicator or read a dial."

U.S. Pat. No. 5,672,964, that issued to Vinci teaches "An ergonomically designed pistol grip voltage probe testing device features visual output indicators, such an LED light, as well as at least one additional or auxiliary indicator such as a buzzer. The LED advantageously changes colors depending on the potential applied to the probe conductor. Other auxiliary output feedback devices are disclosed. The device is particularly suitable for use in an automotive environment, and, in one embodiment, includes a cigarette plug adapter for connecting the device to a cigarette lighter receptacle for supplying output power and a ground reference potential to the test device."

U.S. Pat. No. 6,967,445, that issued to Jewell, et al. teaches "A circuit to monitor electrical continuity through a light bulb when the light bulb is switched off, and to monitor proper functioning of the light bulb when the bulb is switched on. The circuit comprises a LED, a relay and a latching circuit portion, the latching circuit portion configured to remain latched thereby applying power to the bulb and the relay only when the bulb is switched on and lit, and the relay having a pair of normally closed contacts connected to provide an alternative path of minimal resistance to ground for low voltage applied to an incoming side of the LED, and the relay also having a pair of normally open contacts which when closed allow voltage to be applied to the outgoing side of the LED, thereby resulting in the LED lighting when and only when, the light bulb is broken. Most preferably the latching portion of the circuit comprises a silicone controlled rectifier having a trigger circuit portion configured to pulse the gate when a switched light power control line is energized. The switched light power control line is connected to the anode and a coil of the relay, and the cathode is connected to one of the normally closed contacts of the relay and to the light bulb."

U.S. Pat. No. 6,977,493, that issued to Novak et al., teaches "An electrical power probe is provided. In one aspect, an electrical power probe includes a power probe control unit adapted to connect to a direct current (DC) power source and receive an input source voltage from the DC power source. The power probe control unit comprises a power switch controlling the switching of the input source voltage to a cable. A power probe wand includes a conductive wand tip and a user controlled switch, with the wand tip being connected to the power switch by the cable. The power probe control unit sends a query message to the power probe wand. The power probe wand unit sends a response to the power probe control unit in response to the query message, with response indicating the position of the user controlled switch. The power probe control unit selectably switches the power switch based on the position of the user controlled switch."

U.S. Pat. No. 7,528,609, that issued to Savicki, Jr., et al. teaches "The present invention is directed to an electrical testing device for use in an AC electrical power distribution circuit including a plurality of AC electric power transmitting wires coupled between an AC power distribution point and a device box. The device includes a plurality of electrical probes configured for insertion into an outlet receptacle. A plug test connection arrangement is configured to receive a plug connector when inserted therein. The plug connector includes a plurality of plug contacts and a termination arrangement configured to terminate the plurality of AC electric power transmitting wires such that electrical continuity is established between the AC power distribution point and the plurality of plug contacts. The plug test connection arrangement includes a plurality of test contacts configured to mate with the plurality of plug contacts when the plug connector is inserted into the plug test connection arrangement. The termination arrangement being in a detached relationship from the device box after the plurality of AC electric power transmitting wires are terminated. An electrical test circuit is configured to perform at least one electrical test. The electrical test circuit includes a switch mechanism configured to connect the electrical test circuit to the plurality of electrical probes at a first switch setting or connect the electrical test circuit to the plurality of test contacts at a second switch setting. At least one shock mitigation structure is coupled to the plurality of electrical probes or the plug test connection arrangement and is configured to prevent user access to the plurality of electrical probes or the plug test connection arrangement."

U.S. Pat. No. 7,830,154, that issued to Gale teaches "An electrical continuity tester adaptor for attaching to a conventional continuity tester comprising first, second and third members. The first member is operably configured to engage a female F-type connector. The second member is operably configured to engage a female RJ series type connector. The third member includes a plurality of electrical connections and a printed circuit board to facilitate the electrical connectivity between the first and second members."

U.S. Pat. No. 8,018,219, that issued to Calcaterra, et al., teaches "A module is provided for identifying outlets on a common power circuit. The module comprises a connector adapted to electrically couple with an outlet, a signal generator electrically connected to the connector and adapted to send a signal through the connector into a power circuit in response to a predetermined discrete event, an indicator; and logic electrically connected to the connector and the indicator and adapted to detect a signal from another apparatus propagated on a common circuit and activate the indicator in response to the signal."

U.S. Pat. No. 8,496,030, that issued to Mahoney teaches "An electrical circuit tester including a resistive load and a testing station for detecting the variable load. The testing station includes at least one electrical current transducer capable of detecting the variable load in an adjacent electrical power circuit. The detection of the variable load is communicated to the testing station and a variable load detection function."

U.S. Pat. No. 8,866,485, that issued to Lacey, et al., teaches "An electrical circuit tester includes a first testing device and a second testing device provided in a hand-held housing, each being electrically isolated from the other. Multiple light sources are electrically coupled to one of the first and second testing devices to provide a visual indication of the testing result. The first testing device includes a conventional three-prong plug extending out from the surface of the housing and configured to be inserted into a standard electrical receptacle. The second testing device includes one or more keyed cavities, each being designed to receive all or a portion of a plug into the cavity in only one orientation. Each cavity can include at least one blade prong that makes electrical contact with the plug when inserted into the cavity. Both the first and second testing devices can be operated simultaneously with separate sets of light sources providing separate testing indications for each."

U.S. Pat. No. 9,354,256, that issued to Mahoney teaches "An electrical circuit tester including a resistive load and a testing station for detecting the variable load. The testing station includes at least one electrical current transducer capable of detecting the variable load in an adjacent electrical power circuit. The detection of the variable load is communicated to the testing station and a variable load detection function."

U.S. Published Patent Application US2006/0103390, that was published by Simmons teaches "An arc fault circuit interrupter (AFCI) module includes a plug portion, a probe receiving portion and an AFCI test actuator for initiating a test of an AFCI protected circuit. More specifically, the plug portion includes a plurality of prongs configured to mattingly engage with a standard three-prong receptacle. With this construction, upon engaging the plug portion with an AFCI protected receptacle, manipulation of the AFCI test actuator will cause a properly operating AFCI device to trip, i.e., terminate power to the AFCI protected receptacle. The module can also be provided with an AFCI circuit. The module can then be employed to protect an electrical device that is plugged into an unprotected circuit. The probe receiving portion is adapted to interconnect and expand the testing capabilities of a standard receptacle tester or, alternatively, be interconnected with various test probes associated with standard voltage testers."

U.S. Published Patent Application US2014/0266287, that was published by Reeder III, teaches "Devices and methods for enhancing electrical safety are provided herein. Devices testing the safety of light fixtures are provided. Also provided are a variety of testing tools for improving electrical safety. The devices are generally capable of wirelessly communicating with a computer, particularly a hand-held device such as a smart-phone or tablet. Methods for using the devices are also provided."

U.S. Published Patent Application US2016/0327601, that was published by Brockman teaches "A codeless receptacle tester including outlet tester circuitry, a housing, and an indicator section. The outlet tester circuitry is configured to perform a plurality of electrical outlet testing functions. The housing has a first end, a second end opposite the first end, and an enclosure that encloses the outlet tester circuitry. The indicator section is electrically connected to the outlet tester circuitry and has a plurality of indicators. Each indicator of the plurality of indicators is configured to provide a codeless indication of an associated wiring condition of an electrical outlet."

However, none of these solutions still all of the problems associated with testing electrical lines. Thus, it is desirable to solve some of the problems associated with turning electricity on and off on an electrical line for testing or installing a new device.

SUMMARY OF THE INVENTION

In accordance with preferred embodiments of the present invention, some of the problems associated with testing electronic circuits and electronic lines are overcome. A method and apparatus for electrical line testing is presented.

A method and apparatus for electrical line testing. The electrical line testing apparatus provides audio, visual and/or electronic information to indicate electricity is flowing or not flowing through an electrical circuit controlled by a remote circuit breaker or fuse. The method and system help identify which electrical sockets are controlled by the remote circuit breakers. The method and system is used over short distances in a residential home or over long distances in a commercial building such as a warehouse or factory. The method and apparatus is used with or without an external network devices such as a smartphone, electronic tablet, wearable device, etc.

The foregoing and other features and advantages of preferred embodiments of the present invention will be more readily apparent from the following detailed description. The detailed description proceeds with references to the accompanying drawings.

BRIEF DESCRIPTION OF THE DRAWINGS

Preferred embodiments of the present invention are described with reference to the following drawings, wherein:

FIGS. 5A and 5B are a flow diagram illustrating a method for electrical line testing with an electrical line testing apparatus;

FIGS. 6A and 6B are a flow diagram illustrating a method for electrical line testing with an electrical line testing apparatus;

DETAILED DESCRIPTION OF PREFERRED EMBODIMENTS

Exemplary Electrical Line Testing Apparatus

Figure 1:
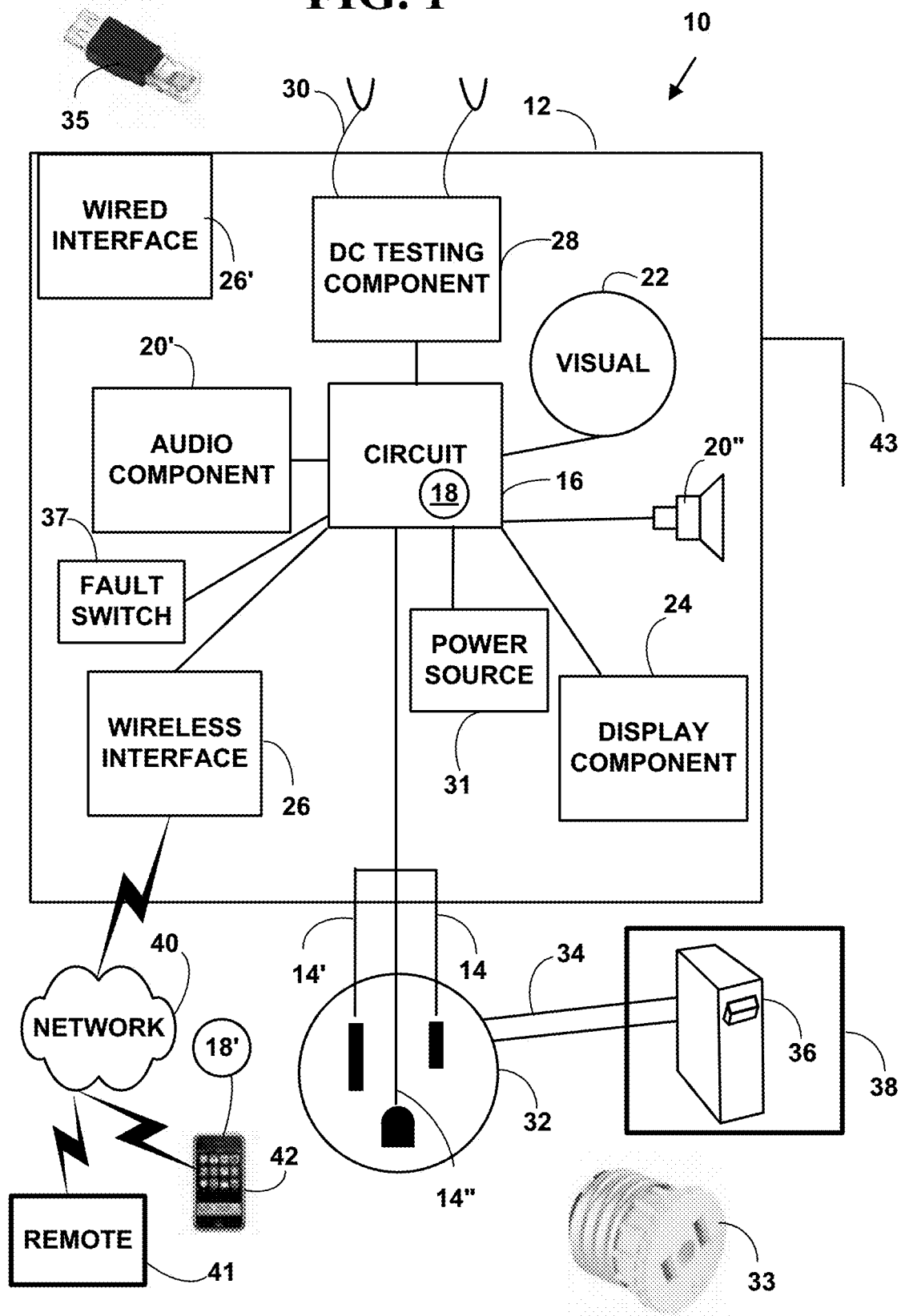
FIG. 1 is a block diagram illustrating an electrical line testing apparatus.

FIG. 1 is a block diagram 10 illustrating an electrical line testing apparatus 12. The an electrical line testing apparatus 12, includes, but is not limited to, plural electrical probes 14 for connecting the apparatus 12 to an alternating current (AC) source, a control circuit 16, a circuit testing application 18 executing in a non-transitory computer readable medium in the control circuit 16, one or more audio components 20, one or more visual components 22, a display screen 24, a wireless interface 26, a wired interface 26', a direct current (DC) connection testing component 28 for connecting the apparatus 12 to a DC source, plural DC connectors 30, a power source 31, one or more AC adapters 33, one or more DC adapters 35, a fault generating switch 37, a volume control 39 and/or one or more remote wireless transceiver components 41. However, present invention is not limited the components described, and more fewer and/or other components can be used to practice the invention.

The plural electrical probes 14 connect to the device to an electrical outlet 32 connected to an electrical circuit 34 in an electrical system. The electrical socket 32 is connected via plural wires in an AC electrical circuit 34 including a circuit breaker 36 or fuse in a circuit breaker box/panel 38 and/or fuse box.

The apparatus 112 is illustrated with electrical sockets 32 in the figures including three-prong electrical sockets for a 120 volt circuit common in the United States. However, the present invention is not limited to use with such sockets or circuits and can be used with different types of electrical sockets for 240/380 volt three phase circuits, etc. in the United States and other sockets and circuits such as 220-240 volt European circuits, etc.

A "circuit breaker" 36 is an automatically
operated electrical switch designed to protect an electrical circuit from damage caused by excess current, typically resulting from an overload or short circuit. Its basic function is to interrupt current flow after a fault is detected. Unlike a fuse, which operates once and then must be replaced, a circuit breaker can be reset (either manually or automatically) to resume normal operation.

A "fuse" is an electrical safety device that operates to provide overcurrent protection of an electrical circuit. Its essential component is a metal wire or strip that melts when too much current flows through it, thereby interrupting the current.

FIG. 1 illustrates two electrical probes 14. One electrical probe 14 is in a contact with a zero-volt electrical line (e.g., larger rectangle in socket 32) and a second electrical probe 14' is in contact with an electrical line include a non-zero voltage (e.g., 120 volts, etc. in smaller rectangle) in electrical socket 32. A third electrical component may be in contract with a ground line 14" in electrical socket 32. However, the present invention may be used with and/or without an electrical probe 14 touching the ground line 14". However, the present invention is not limited to the electrical probes 14 and more or fewer electrical probes 14 can be used to practice the invention.

Alternating current (AC) occurs when charge carriers in a conductor or semiconductor periodically reverse their direction of movement. Household electrical current in most countries including the United States includes AC with a frequency of 60 Hertz (Hz) (i.e., 60 cycles per second). However, in many countries AC current includes a frequency 50 Hz. The radio-frequency ("RF") current in antennas and transmission lines is another example of AC.

An AC waveform can be sinusoidal, square, or sawtooth-shaped. Some AC waveforms are irregular or complicated. An example of sine-wave AC is common household electrical current. Square or sawtooth waves are produced by certain types of electronic oscillators, and by a low-end uninterruptible power supply ("UPS") when it is operating from its battery. Irregular AC waves are produced by audio amplifiers that deal with analog voice signals and/or music.

The control circuit 16 is configured for automatically testing an electrical circuit by controlling the other components of the electrical line testing apparatus 12.

In one embodiment, the control circuit 16 includes an integrated circuit (IC) or monolithic integrated circuit (also referred to as an IC, a chip, or a microchip). An integrated circuit is a set of electronic circuits on one small plate ("chip") of semiconductor material, normally silicon. However, the present invention is not limited to such an embodiment and other types of circuits can be used to practice the invention.

In one embodiment, the control circuit 16 may include one or more fuses. A fuse is an electrical safety device that operates to provide overcurrent protection of an electrical circuit. Its essential component is a metal wire or strip that melts when too much current flows through it, thereby interrupting the current and it must be replaced. The one or more fuses provide a level of safety to the apparatus 12.

The control circuit 16 with the non-transitory computer readable medium includes an operating environment for the present invention comprising a processing system with one or more high speed Central Processing Unit(s) ("CPU") or other types of processors, a non-transitory computer readable medium including a computer memory.

In accordance with the practices of persons skilled in the art of computer programming, the present invention is described with reference to acts and symbolic representations of operations or instructions that are performed by the circuit 16, unless indicated otherwise. Such acts and operations or instructions are referred to as being "computer-executed," "CPU executed" or "processor executed."

It will be appreciated that acts and symbolically represented operations or instructions include the manipulation of electrical signals by a CPU or other processor. An electrical system represents data bits which cause a resulting transformation or reduction of the electrical signals, and the maintenance of data bits at memory locations in a memory system to thereby reconfigure or otherwise alter the CPU's or processors operation, as well as other processing of signals. The memory locations where data bits are maintained are physical locations that have particular electrical, magnetic, optical, or organic properties corresponding to the data bits.

The data bits may also be maintained on a non-transitory computer readable medium including magnetic disks, optical disks, organic memory, and any other volatile (e.g., Random Access Memory ("RAM")) or non-volatile (e.g., Read-Only Memory ("ROM")) mass storage system readable by the CPU or other processor.

In one embodiment, electronic line testing apparatus 12 is in communications with a communications network 40. The communications network 40 includes, but is not limited to, the Internet, an intranet, a wired Local Area Network (LAN), a wireless LAN (WiLAN), a Wide Area Network (WAN), a Metropolitan Area Network (MAN), Public Switched Telephone Network (PSTN), mesh networks, and/or other types and combinations of wired and wireless communications networks 40 providing communications with wired or wireless communication protocols.

In one embodiment, the communications network 40 includes a cloud communications network 40 comprising plural different cloud component networks, a public (e.g. Internet, PSTN, etc.), private (e.g., LAN, WAN, etc.), hybrid (e.g., Internet plus private LAN, etc.), and/or community (e.g., Internet plus, private LAN, plus PSTN, etc.) networks.

In one embodiment, the electronic circuit 16 includes the Open Systems Interconnection ("OSI") reference model. The OSI is a layered architecture that standardizes levels of service and types of interaction for network devices exchanging information through a communications network 40. The OSI reference model separates network device-to-network device communications into seven protocol layers, or levels, each building—and relying—upon the standards contained in the levels below it. The OSI reference model includes from lowest-to-highest, a physical, data-link, network, transport, session, presentation and application layer. The lowest of the seven layers deals solely with hardware links; the highest deals with software interactions at the application-program level.

The Internet Protocol ("IP") reference model is a layered architecture that standardizes levels of service for the Internet Protocol suite of protocols. The Internet Protocol reference model comprises in general from lowest-to-highest, a link, network, transport and application layer.

The circuit testing application 18 includes a software, firmware and/or hardware application.

Figure 2:
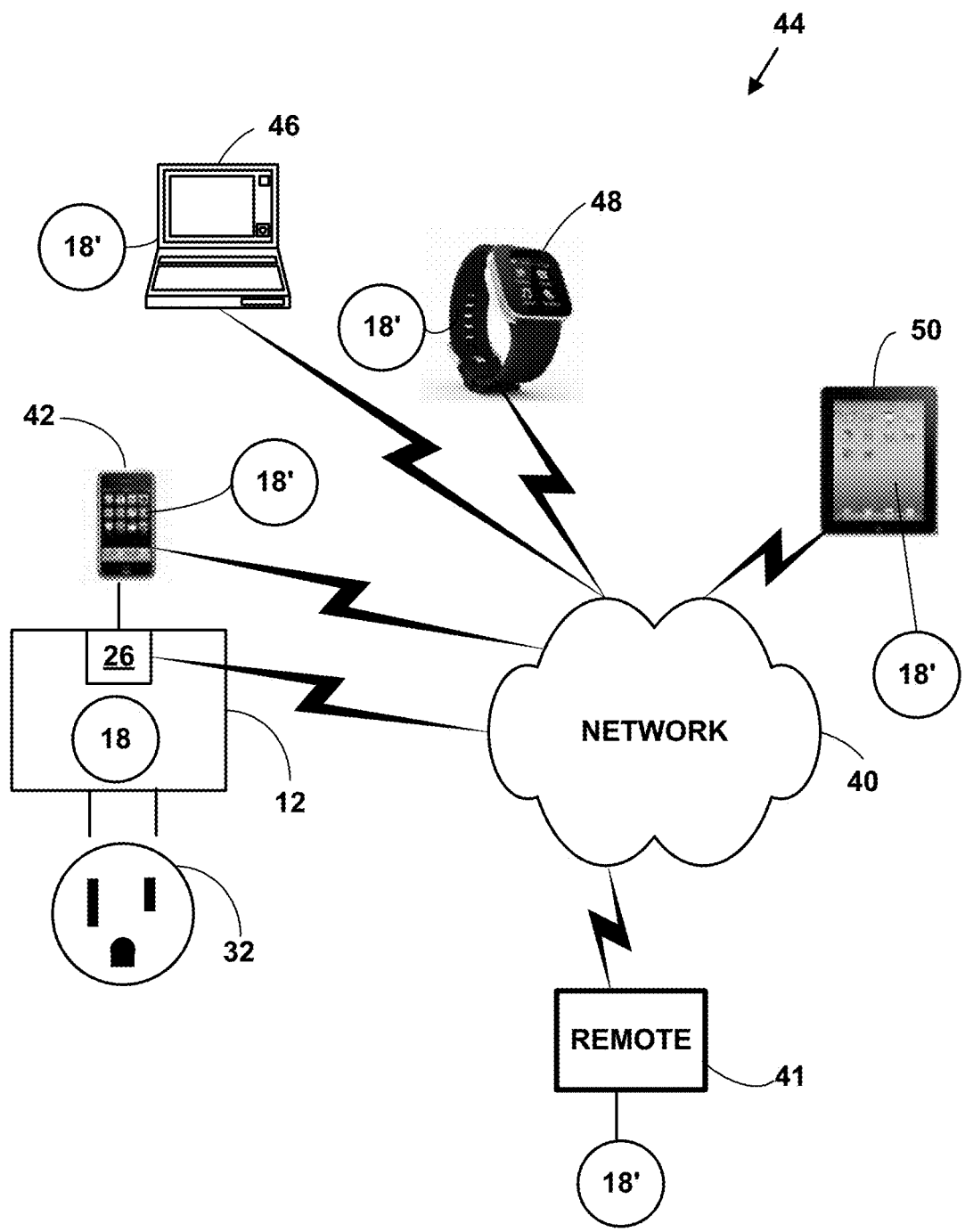
FIG. 2 is a block diagram illustrating an electrical line testing network.

FIG. 2 is a block diagram 44 illustrating an electrical line testing apparatus 12 network.

The circuit testing application 18 communicates via the wireless interface 26 and/or wired interface 26' with other applications 18' executing in a non-transitory computer readable medium on a target network device 42, 46, 48, 50, with one or more processors. The target network devices, include but are not limited to, smart phones 42, computers 46, wearable network devices 48, electronic tablets 50, etc. However, present invention is not limited the target network devices described, and more fewer and/or other target network devices can be used to practice the invention.

Returning to FIG. 1, one or more audio components 20, include, but are not limited to, a speaker 20, a buzzer, a bell 20" and/or other components that produce and audible sound. However, present invention is not limited the components described, and more fewer and/or other components can be used to practice the invention.

The speaker 20' is a component including a transducer that converts electrical signals (i.e., electric current) into sound waves (i.e., acoustic energy) for the production of an audible sound. In one embodiment, the circuit 16 and/or the circuit testing application 18 creates one or more different types of electrical signals that produce one or more different types of audible sounds on the speaker 20'.

The buzzer 20" is a component including audio signaling device, which may be mechanical, electromechanical, or piezoelectric. A piezoelectric buzzer is driven by an oscillating electronic circuit or other audio signal source and driven with a piezoelectric audio amplifier that produces an audible sound.

The bell 20" is a component including audio signaling device that produces an audible sound.

The one or more visual components 22 indicate that electricity is flowing. The one or more visual components 22 include one or more incandescent light bulb components, one or more High-Intensity Discharge (HID) bulb components, one or more light emitting diode (LED) components and/or one or more strobe components. However, present invention is not limited the components described, and more fewer and/or other components can be used to practice the invention.

The incandescent light bulbs include an electric light with a wire filament heated to such a high temperature that it glows with visible light (i.e., incandescence). The filament, heated by passing an electric current through it, is protected from oxidation with a glass or fused quartz bulb that is filled with inert gas or evacuated. In a halogen lamp, filament evaporation is slowed by a chemical process that redeposits metal vapor onto the filament, extending its life. The light bulb is supplied with electric current by feed-through terminals or wires embedded in the glass. Most bulbs are used in a socket which provides mechanical support and electrical connections. Incandescent bulbs are manufactured in a wide range of sizes, light output, and voltage ratings, from 1.5 volts to about 300 volts.

The High-Intensity Discharge (HID) bulbs produce light when an arc passes between cathodes in a pressurized tube, causing metallic additives to vaporize. They have long lives and are extremely energy efficient, but—with the exception of metal halides—they do not produce pleasing light colors.

A light-emitting diode (LED) is a two-lead semiconductor light source. It resembles a basic pn-junction diode, which emits light when activated. LEDs are used as indicator lamps for electronic devices, replacing small incandescent bulbs. LEDs have many advantages over incandescent light sources including lower energy consumption, longer lifetime, improved physical robustness, smaller size, and faster switching. The LED 20 includes various colors including, but not limited to red, green, blue, yellow, etc.

In one embodiment, the LED is a dual color LED and/or includes plural LEDs with different colors, that displays a first color, (e.g., red, etc.), when the apparatus 12 is not activated for testing but in an operation state and a second color (e.g., green, blue, etc.) when the apparatus 12 has been activated by electrical current. However, the present invention is not limited to such an embodiment and more, fewer and/or other types of LEDs and color combinations can be used to practice the invention.

A "strobe light" or "stroboscopic lamp," commonly called a "strobe," is a device used to produce regular flashes of light. A typical strobe light has a flash energy in the region of 10 to 150 joules, and discharge times as short as a few milliseconds, often resulting in a flash power of several kilowatts. Strobe lights can also be used in a "continuous" mode, producing extremely intense illumination. The light source is typically a xenon flash lamp, or flashtube, which has a complex spectrum and a color temperature of approximately 5,600 Kelvins. To obtain colored strobe lights, colored gels are used. Strobe lights remain visible in low visibility light conditions as well as very bright and/or reflective light conditions. However, the invention is not limited to the types of strobe lights described and other types of lights can be used to practice the invention.

In one embodiment, the strobe component includes a very bright, directional strobe light (e.g., red, orange, white, blue or yellow in color, etc.) manufactured and installed in a directional manner so as to be able to be visible from a wide variety of angles and light conditions by a user of the apparatus 12. The strobe is triggered (e.g., emits a series of flashes, etc.) when electricity is flowing through the electrical circuit 34. The strobe is de-activated (e.g., does not emit the series of flashes, etc.) when electricity is not flowing through the electrical circuit 34.

However, the present invention is not limited to the visual components 22 described and other types of light components can be used to practice the invention.

In one embodiment, the display screen 24 includes a Liquid Crystal Display (LCD) screen 24 and/or other type of display screen. In such an embodiment, the LCD display screen 24 instructs the user through the circuit testing process and provides circuit testing information. The LCD screen 24 is also used to display status and error messages, etc. However, the present invention is not limited to such an embodiment and the present invention can be practiced with and/or without and LCD display screen 24. However, present invention is not limited the components described, and more fewer and/or other components can be used to practice the invention.

Wireless Interfaces

In one embodiment of the present invention, the wireless interface 26 used for the electrical line testing apparatus 12 and network devices 42, 46, 48, 50 include but are not limited to, a cellular telephone, Short Message Service ("SMS"), instant message, IEEE 802.11a, 802.11ac, 802.11b, 802.11g, 802.11n, "Wireless Fidelity" ("Wi-Fi"), Wi-Fi Aware, "Worldwide Interoperability for Microwave Access" ("WiMAX"), ETSI High Performance Radio Metropolitan Area Network ("HIPERMAN"), "RF Home" Zigbee, Z-wave, Bluetooth, Infrared, Industrial, Scientific and Medical ("ISM"), Radio Frequency Identifier ("RFID"), Near field communication ("NFC"), Machine-2-Machine ("M2M"), and/or other long range or short range wireless and/or wired interfaces may be used to practice the invention.

The cellular telephone wireless interface includes a type of short-wave analog or digital wireless interface in which a subscriber has a wireless connection from a mobile phone 42 to a relatively nearby telephone transmitter tower. The telephone transmitter's tower span of coverage is called a ("cell").

SMS or "text messaging" is type of communications service that enables a user to allow private message communications with another user. SMS is typically a standard component of phone, Web, or mobile communication systems. It uses standardized communications protocols to allow fixed line or mobile phone or wearable mobile devices to exchange short text messages including digital pictures.

Instant messaging (IM) is a type of online chat that offers real-time text transmission over a communications network 40. It uses standardized communications protocols to allow fixed, mobile or wearable mobile devices to exchange short electronic text messages including digital pictures.

802.11b defines a short-range wireless network interface. The IEEE 802.11b standard defines wireless interfaces that provide up to 11 Mbps wireless data transmission to and from wireless devices over short ranges. 802.11a is an extension of the 802.11b and can deliver speeds up to 54M bps. 802.11g deliver speeds on par with 802.11a. However, other 802.11xx interfaces can also be used and the present invention is not limited to the 802.11 protocols defined. The IEEE 802.11a, 802.11an, 802.11b, 802.11g and 802.11n standards are incorporated herein by reference.

Wi-Fi is another type of 802.11xx interface, whether 802.11b, and/or 802.11a/802.11c dual-band, etc. Wi-Fi devices include an RF interfaces such as 2.4 GHz for 802.11b or 802.11g and 5 GHz for 802.11a.

Wi-Fi Aware is a new capability for energy-efficient, proximity-based service discovery among Wi-Fi capable devices. The technology in Wi-Fi Aware enables network devices to discover other devices, applications, and information nearby before making a Wi-Fi connection. Wi-Fi Aware makes contextual awareness more immediate and useful, enabling personalized applications (e.g., 26, 26', etc.) that continuously scan surroundings, anticipate actions, and notify of services and selected preferences. Wi-Fi Aware devices go through a process of discovery and synchronization, establishing a common "heartbeat" that enables very power efficient operation. Devices form clusters and exchange small messages about services available nearby, enabling immediate discovery. Wi-Fi Aware's ability to send and receive tiny messages before establishing a network connection further enables a two-way conversation among network devices in emergency and non-emergency situations whose current physical geographic locations and/or 2D/3D geo-space information may be known and available. This capability not only enables a network device to discover nearby information and services, but request additional information, such as emergency location information—all without establishing, an Internet, PSTN, or other network connections. The Wi-Fi Aware reference document, wp_Wi-Fi_Aware_Industry_20150714_v2, Jul. 14, 2015, is incorporated herein by reference.

In one embodiment, the circuit testing application 18 includes Wi-Fi Aware capabilities. In one embodiment the wireless interfaces include Wi-Fi Aware wireless interface capabilities. However, the present invention is not limited to these embodiments and the invention can be practiced without Wi-Fi Aware capabilities.

WiMAX is an industry trade organization formed by communications component and equipment companies to promote and certify compatibility and interoperability of broadband wireless access equipment that conforms to the IEEE 802.16xx and ETSI HIPERMAN. HIPERMAN is the European standard for MANs.

The IEEE The 802.16a, 802.16c, 802.16d 802.16e and 802.16g standards are wireless MAN technology standard that provides a wireless alternative to cable, DSL and T1/E1 for last mile broadband access. It is also used as complimentary technology to connect IEEE 802.11xx hot spots to the Internet.

The IEEE 802.16a standard for 2-11 GHz is a wireless MAN technology that provides broadband wireless connectivity to fixed, portable and nomadic devices. It provides up to 50-kilometers of service area range, allows users to get broadband connectivity without needing direct line of sight with the base station, and provides total data rates of up to 280 Mbps per base station, which is enough bandwidth to simultaneously support hundreds of businesses with T1/E1-type connectivity and thousands of homes with DSL-type connectivity with a single base station. The IEEE 802.16g provides up to 100 Mbps.

The IEEE 802.16e standard is an extension to the approved IEEE 802.16/16a/16g standard. The purpose of 802.16e is to add limited mobility to the current standard which is designed for fixed operation.

The ESTI HIPERMAN standard is an interoperable broadband fixed wireless access standard for systems operating at radio frequencies between 2 GHz and 11 GHz.

The IEEE 802.16a, 802.16d, 802.16e and 802.16g standards are incorporated herein by reference. WiMAX can be used to provide a wireless local loop (WLP).

The ETSI HIPERMAN standards TR 101 031, TR 101 475, TR 101 493-1 through TR 101 493-3, TR 101 761-1 through TR 101 761-4, TR 101 762, TR 101 763-1 through TR 101 763-3 and TR 101 957 are incorporated herein by reference.

IEEE 802.15.4 (Zigbee) is low data rate network standard used for mesh network devices such as sensors, interactive toys, smart badges, remote controls, and home automation. The 802.15.4 standard provides data rates of 250 kbps, 40 kbps, and 20 kbps., two addressing modes; 16-bit short and 64-bit IEEE addressing, support for critical latency devices, such as joysticks, Carrier Sense Multiple Access/Collision Avoidance, (CSMA-CA) channel access, automatic network establishment by a coordinator, fully handshaked protocol for transfer reliability, power management to ensure low power consumption for multi-month to multi-year battery usage and up to 16 channels in the 2.4 GHz ISM band (Worldwide), 10 channels in the 915 MHz (US) and one channel in the 868 MHz band (Europe). The IEEE 802.15.4-2003 standard is incorporated herein by reference.

Z-wave is a wireless communications protocol used primarily for home automation. It is a mesh network protocol using low-energy radio waves to communicate between Internet of Things (IoT) network devices, allowing for wireless control of IoT devices. Z-Wave uses Part 15 of the ISM band. It operates at 908.42 MHz in the U.S. and Canada and as other frequencies in other countries. Recently, the International Telecommunications Union (ITU) included the Z-Wave physical and media access control (MAC) layers as an option in its new G.9959 standard, which defines a set of guidelines for sub-1-GHz narrowband wireless devices. The ITU G.9959 standard is incorporated by reference.

Bluetooth (IEEE 802.15.1a) is a short-range radio frequency technology aimed at simplifying communications among network devices and between network devices. Bluetooth wireless technology supports both short-range point-to-point and point-to-multipoint connections. The Bluetooth Specification, GL 11r02, March 2005, prepared by the Bluetooth SIG, Inc. and the IEEE 802.15.1a standard are incorporated herein by reference.

Infra data association (IrDA) is a short-range radio wireless Bluetooth or wireless infrared communications. Industrial, Scientific and Medical (ISM) are short-range radio wireless communications interfaces operating at 400 MHz, 800 MHz, and 900 Mhz. ISM sensors may be used to provide wireless information to practice the invention.

An RFID is an automatic identification method, relying on storing and remotely retrieving data using devices called RFID tags or transponders. An RFID tag is a small object that can be attached to or incorporated into a product, animal, or person. RFID tags contain antennas to enable them to receive and respond to radio-frequency queries from an RFID transceiver. Passive tags require no internal power source, whereas active tags require a power source 31. RFID sensors and/or RFID tags are used to provide wireless information to practice the invention.

Passive tags are powered by received radiation from a reading device and require no internal source of power; thus, they can be manufactured at very low cost and require no ongoing maintenance as long as they are not removed or physically damaged. Passive tags can only be read by a reader device in close proximity to the tag.

RFID Passive tags can be manufactured in a sticker-like form factor and held in place by adhesive, providing very low installation cost; however, such an arrangement is not heat-resistant, and conventional mechanical mounting employing screws or cover plates is advisable for at least a minimal subset of all installed tags.

RFID Passive tags are typically capable of providing a 96-bit number to a tag reader: 96 bits allow $2^{96}=10^{29}$ (100 billion billion billion) possible codes, ample to allow unique identification.

RFID active tags may also be employed for location awareness. Active tags have longer range and can include more sophisticated functionality.

RFID Active tags are also deployed in a mesh network that would allow information to pass from tag to tag. This type of network would allow tag and reader information to be passed from location to location and possibly from floor to floor to move the information to a central location or to the building wall ultimately making it easier to access. Active tag networks have significant functional advantages, but are relatively expensive and maintenance-intensive compared to passive tags.

In one embodiment, the apparatus 12 communicates with other network devices with near field communications (NFC) and/or machine-to-machine (M2M) communications.

"Near field communication (NFC)" is a set of standards for smartphones and similar devices to establish radio communication with each other by touching them together or bringing them into close proximity, usually no more than a few centimeters. Present and anticipated applications include contactless transactions, data exchange, and simplified setup of more complex communications such as Wi-Fi. Communication is also possible between an NFC device and an unpowered NFC chip, called a "tag" including radio frequency identifier (RFID) tags.

NFC standards cover communications protocols and data exchange formats, and are based on existing radio-frequency identification (RFID) standards including ISO/IEC 14443 and FeliCa. These standards include ISO/IEC 1809 and those defined by the NFC Forum, all of which are incorporated by reference.

"Machine to machine (M2M)" refers to technologies that allow both wireless and wired systems to communicate with other devices of the same ability. M2M uses a device to capture an event (such as option purchase, etc.), which is relayed through a network (wireless, wired cloud, etc.) to an application (software program), that translates the captured event into meaningful information. Such communication was originally accomplished by having a remote network of machines relay information back to a central hub for analysis, which would then be rerouted into a system like a personal computer.

However, modern M2M communication has expanded beyond a one-to-one connection and changed into a system of networks that transmits data many-to-one and many-to-many to plural different types of devices and appliances. The expansion of IP networks across the world has made it far easier for M2M communication to take place and has lessened the amount of power and time necessary for information to be communicated between machines.

In one embodiment, the communications network 40 also includes a cellular telephone network, Personal Communications Services network ("PCS"), Packet Cellular Network ("PCN"), Global System for Mobile Communications, ("GSM"), Generic Packet Radio Services ("GPRS"), Cellular Digital Packet Data ("CDPD") or a Wireless Application Protocol ("WAP") network.

Returning to FIG. 1, in one embodiment, the wireless interface 26 is replaced with a wired interface 26'. In another embodiment, only wired interface 26' is used in apparatus 12. In another embodiment both wireless interface 26 and wired interface 26' are used in apparatus 12.

The wired interface 26' connects the apparatus 12 with a wired LAN, Public Switched Telephone Network (PSTN) and/or a cable television network (CATV) including high definition television (HDTV) via one or more twisted pairs of copper wires, digital subscriber lines (e.g. DSL, ADSL, VDSL, etc.) coaxial cable, fiber optic cable, other wired connection media or other wired connection interfaces. The PSTN is any public switched telephone network provided by AT&T, CenturyLink, FairPoint, Frontier, Sprint, Verizon, and other Local Exchange Carriers, etc. However, the present invention is not limited to the wired interfaces described and other types of wired interfaces can be used to practice the invention.

Wearable Devices

"Wearable mobile technology" and/or "wearable devices" are clothing and accessories incorporating computer and advanced electronic technologies. Wearable mobile network devices provide several advantages including, but not limited to: (1) Quicker access to notifications. Important and/or summary notifications are sent to alert a user to view a whole new message. (2) Heads-up information. Digital eye wear allows users to display relevant information like directions without having to constantly glance down; (3) Always-on Searches. Wearable devices provide always-on, hands-free searches; and (4) Recorded data and feedback. Wearable devices also take telemetric data recordings and providing useful feedback for users for exercise, health, fitness, activities etc.

Figure 3:
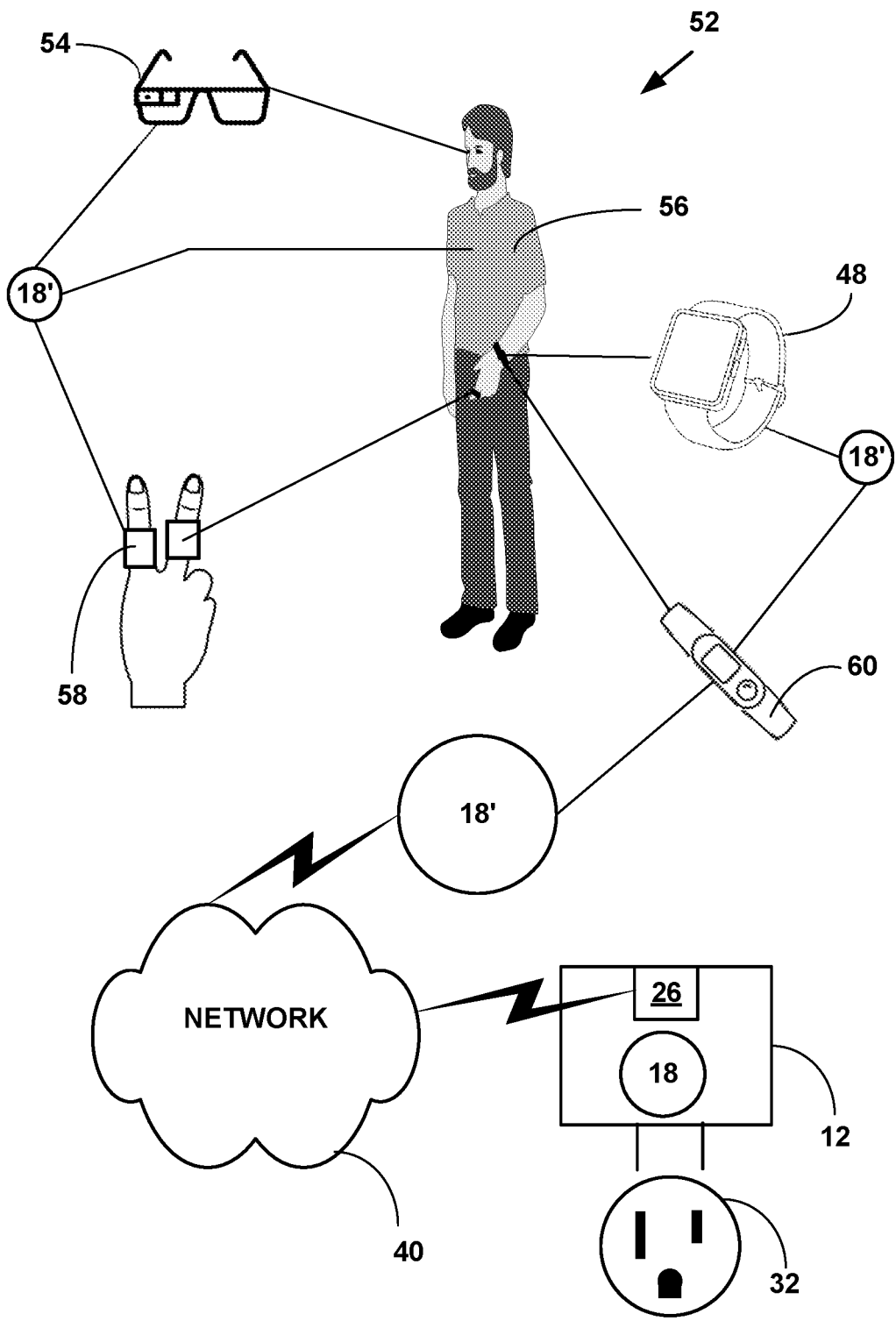
FIG. 3 is a block diagram illustrating wearable network devices used with an electrical line testing apparatus.

FIG. 3 is a block diagram 52 illustrating wearable network devices used with an electrical line testing apparatus 12.

The wearable network devices include, but are not limited to, wearable digital glasses 54 (e.g., GOOGLE Glass, etc.), clothing 56 (e.g., smart ties 56', smart headwear, smart tops and bottoms, shoes, etc.), jewelry 58 (e.g., smart rings, smart earrings, etc.), watches 48 (e.g., SONY, NIKE, SAMSUNG, NIKE, GARMIN, etc.) and/or wrist bands or fitness bands 60 (e.g. GARMIN, FITBIT, POLAR, NIKE, JAWBONE, LG, etc.). The wearable mobile devices includes an application 18' to communicate with apparatus 12 during the testing of an electrical circuit All of the wearable devices 48, 54, 56, 58 and 60 have one or more processors, a non-transitory computer readable medium and/or selected ones have other components including, but not limited to, accelerometers, altimeters, music control, phone compatibility, etc. However, the present invention is not limited to such wearable devices and more, fewer and other types of wearable devices can also be used to practice the invention.

In one embodiment, the digital glasses 54 include a heads up display (HUD) to display electronic information provided by the apparatus 12. However, the present invention is not limited to digital glasses 54 with a HUD and other embodiments can be used to practice the invention.

Security and Encryption

Returning to FIG. 1 the apparatus 12, devices, network devices 42, 46, 48, 50, 48, 54, 56, 58 and 60 and wireless 26 and wired 26' interfaces of the present invention may include security and encryption for secure communications. Wireless Encryption Protocol (WEP) (also called "Wired Equivalent Privacy) is a security protocol for WiLANs defined in the IEEE 802.11b standard. WEP is cryptographic privacy algorithm, based on the Rivest Cipher 4 (RC4) encryption engine, used to provide confidentiality for 802.11b wireless data.

RC4 is cipher designed by RSA Data Security, Inc. of Bedford, Mass., which can accept encryption keys of arbitrary length, and is essentially a pseudo random number generator with an output of the generator being XORed with a data stream to produce encrypted data.

One problem with WEP is that it is used at the two lowest layers of the OSI model, the physical layer and the data link layer, therefore, it does not offer end-to-end security. One another problem with WEP is that its encryption keys are static rather than dynamic. To update WEP encryption keys, an individual has to manually update a WEP key. WEP also typically uses 40-bit static keys for encryption and thus provides "weak encryption," making a WEP device a target of hackers.

The IEEE 802.11 Working Group is working on a security upgrade for the 802.11 standard called "802.11i." This supplemental draft standard is intended to improve WiLAN security. It describes the encrypted transmission of data between systems 802.11X WiLANs. It also defines new encryption key protocols including the Temporal Key Integrity Protocol (TKIP). The IEEE 802.11i draft standard, version 4, completed Jun. 6, 2003, is incorporated herein by reference.

The 802.11i is based on 802.1x port-based authentication for user and device authentication. The 802.11i standard includes two main developments: Wi-Fi Protected Access (WPA) and Robust Security Network (RSN).

WPA uses the same RC4 underlying encryption algorithm as WEP. However, WPA uses TKIP to improve security of keys used with WEP. WPA keys are derived and rotated more often than WEP keys and thus provide additional security. WPA also adds a message-integrity-check function to prevent packet forgeries.

RSN uses dynamic negotiation of authentication and selectable encryption algorithms between wireless access points and wireless devices. The authentication schemes proposed in the draft standard include Extensible Authentication Protocol (EAP). One proposed encryption algorithm is an Advanced Encryption Standard (AES) encryption algorithm.

Dynamic negotiation of authentication and encryption algorithms lets RSN evolve with the state of the art in security, adding algorithms to address new threats and continuing to provide the security necessary to protect information that WiLANs carry.

The NIST developed a new encryption standard, the Advanced Encryption Standard (AES) to keep government information secure. AES is intended to be a stronger, more efficient successor to Triple Data Encryption Standard (3DES).

DES is a popular symmetric-key encryption method developed in 1975 and standardized by ANSI in 1981 as ANSI X.3.92, the contents of which are incorporated herein by reference. 3DES is the encrypt-decrypt-encrypt (EDE) mode of the DES cipher algorithm. 3DES is defined in the ANSI standard, ANSI X9.52-1998, the contents of which are incorporated herein by reference. DES modes of operation are used in conjunction with the NIST Federal Information Processing Standard (FIPS) for data encryption (FIPS 46-3, October 1999), the contents of which are incorporated herein by reference.

The NIST approved a FIPS for the AES, FIPS-197. This standard specified "Rijndael" encryption as a FIPS-approved symmetric encryption algorithm that may be used by U.S. Government organizations (and others) to protect sensitive information. The NIST FIPS-197 standard (AES FIPS PUB 197, November 2001) is incorporated herein by reference.

The NIST approved a FIPS for U.S. Federal Government requirements for information technology products for sensitive but unclassified (SBU) communications. The NIST FIPS Security Requirements for Cryptographic Modules (FIPS PUB 140-2, May 2001) is incorporated herein by reference.

RSA is a public key encryption system which can be used both for encrypting messages and making digital signatures. The letters RSA stand for the names of the inventors: Rivest, Shamir and Adleman. For more information on RSA, see U.S. Pat. No. 4,405,829, now expired and incorporated herein by reference.

"Hashing" is the transformation of a string of characters into a usually shorter fixed-length value or key that represents the original string. Hashing is used to index and retrieve items in a database because it is faster to find the item using the shorter hashed key than to find it using the original value. It is also used in many encryption algorithms.

Secure Hash Algorithm (SHA), is used for computing a secure condensed representation of a data message or a data file. When a message of any length $<2^{64}$ bits is input, the SHA-1 produces a 160-bit output called a "message digest." The message digest can then be input to other security techniques such as encryption, a Digital Signature Algorithm (DSA) and others which generates or verifies a security mechanism for the message. SHA-512 outputs a 512-bit message digest. The Secure Hash Standard, FIPS PUB 180-1, Apr. 17, 1995, is incorporated herein by reference.

Message Digest-5 (MD-5) takes as input a message of arbitrary length and produces as output a 128-bit "message digest" of the input. The MD5 algorithm is intended for digital signature applications, where a large file must be "compressed" in a secure manner before being encrypted with a private (secret) key under a public-key cryptosystem such as RSA. The IETF RFC-1321, entitled "The MD5 Message-Digest Algorithm" is incorporated here by reference.

Providing a way to check the integrity of information transmitted over or stored in an unreliable medium such as a wireless network is a prime necessity in the world of open computing and communications. Mechanisms that provide such integrity check based on a secret key are called "message authentication codes" (MAC). Typically, message authentication codes are used between two parties that share a secret key in order to validate information transmitted between these parties.

Keyed Hashing for Message Authentication Codes (HMAC), is a mechanism for message authentication using cryptographic hash functions. HMAC is used with any iterative cryptographic hash function, e.g., MD5, SHA-1, SHA-512, etc. in combination with a secret shared key. The cryptographic strength of HMAC depends on the properties of the underlying hash function. The IETF RFC-2101, entitled "HMAC: Keyed-Hashing for Message Authentication" is incorporated here by reference.

An Electronic Code Book (ECB) is a mode of operation for a "block cipher," with the characteristic that each possible block of plaintext has a defined corresponding cipher text value and vice versa. In other words, the same plaintext value will always result in the same cipher text value. Electronic Code Book is used when a volume of plaintext is separated into several blocks of data, each of which is then encrypted independently of other blocks. The Electronic Code Book has the ability to support a separate encryption key for each block type.

Diffie and Hellman (DH) describe several different group methods for two parties to agree upon a shared secret in such a way that the secret will be unavailable to eavesdroppers. This secret is then converted into various types of cryptographic keys. A large number of the variants of the DH method exist including ANSI X9.42. The IETF RFC-2631, entitled "Diffie-Hellman Key Agreement Method" is incorporated here by reference.

However, the present invention is not limited to the security or encryption techniques described and other security or encryption techniques can also be used.

The HyperText Transport Protocol (HTTP) Secure (HTTPs), is a standard for encrypted communications on the World Wide Web. HTTPs is actually just HTTP over a Secure Sockets Layer (SSL). For more information on HTTP, see IETF RFC-2616 incorporated herein by reference.

The SSL protocol is a protocol layer which may be placed between a reliable connection-oriented network layer protocol (e.g. TCP/IP) and the application protocol layer (e.g. HTTP). SSL provides for secure communication between a source and destination by allowing mutual authentication, the use of digital signatures for integrity, and encryption for privacy.

The SSL protocol is designed to support a range of choices for specific security methods used for cryptography, message digests, and digital signatures. The security method are negotiated between the source and destination at the start of establishing a protocol session. The SSL 2.0 protocol specification, by Kipp E. B. Hickman, 1995, is incorporated herein by reference.

Transport Layer Security (TLS) provides communications privacy over the Internet. The protocol allows client/server applications to communicate over a transport layer (e.g., TCP) in a way that is designed to prevent eavesdropping, tampering, or message forgery. For more information on TLS see IETF RFC-2246, incorporated herein by reference.

However, the present invention is not limited to the security and encryption methods and protocols described and more, fewer and other types of security and encryption can be used to practice the invention.

Returning to FIG. 1, the direct current (DC) connection test component 28 for connecting the apparatus 12 to a DC circuit. The DC connection test component 28 includes plural DC connectors 30.

Direct current (DC) is a unidirectional flow of electric charge. A battery is a good example of a DC power supply. Direct current may flow in a conductor such as a wire, but can also flow through semiconductors, insulators, or even through a vacuum as in electron or ion beams. The electric current in a DC circuit flows in a constant direction, distinguishing it from AC.

The plural DC connectors include wires 30 (illustrated in FIG. 1) and other types of DC connectors such as clips and network connectors, including but not limited to, RJ-11, RJ-45, and other types of network connectors. However, the present invention is not limited to the DC connectors described and more, fewer and other types of DC connectors can be used to practice the invention.

In one embodiment, the plural DC connectors 30 are used to test Power over Ethernet ("PoE") DC circuits. PoE is a technology for wired Ethernet LANs that allows the electrical current necessary for the operation of connected network devices (e.g., 42, 46, 48, 50, etc.) to be carried by data cables rather than by power cords. Doing so minimizes the number of wires that must be strung in order to install a wired LAN network 40. PoE typically delivers 48 volts of DC power over unshielded twisted-pair wiring for network devices consuming less than 13 watts of power. However, the present invention is not limited to the PoE described and more, fewer and other types of PoE networks can be used to practice the invention.

Returning again to FIG. 1, the optional power source 31 are used to provide power to the control circuit 16 and/or other components of apparatus 12 when it is not connected to an AC power source. The power source 31 includes, but is not limited to, a battery, capacitor and/or other power source 31. The power source 31 may also be used for testing DC circuits. However, the present invention is not limited to the power sources described and more, fewer and other types of power sources can be used to practice the invention.

A "battery" includes a container comprising one or more cells, in which chemical energy is converted into electricity and used as a source of power. Batteries are distinguished by their chemical makeup. A battery chemical unit, called the "cell," includes three main parts; a positive terminal called a "cathode," negative terminal called an "anode," and an "electrolyte." The battery charges and discharges through a chemical reaction that generates a voltage. The battery is able to provide a consistent DC voltage. In rechargeable batteries, the chemical energy that is converted into electricity can be reversed using an outside electrical energy to restore the charge.

In one embodiment, the power source 31 is used to power the apparatus when testing a DC electrical circuit. However, the present invention is not limited to this embodiment and the plural electrical probes 14 are also used to provide power when testing a DC electrical circuit in other embodiments.

A "capacitor" includes of two or more conductive plates separated by a dielectric. When an electric current enters the capacitor, the dielectric stops the flow and a charge builds up and is stored in an electric field between the plates. Each capacitor is designed to have a particular capacitance (energy storage). When a capacitor is connected to an external circuit 16, a current will rapidly discharge.

However, present invention and the apparatus 12 is not limited the components described, and more fewer and/or other components can be used to practice the invention.

In one embodiment, the electrical line testing apparatus 12 includes a screw socket adapter 33 for AC electrical circuits. The screwed socket adapter 33 is screwed into a lighting component in place of a light bulb. The electrical line testing apparatus 12 is then inserted into electrical socket receptacles in the screw socket adapter 33 for testing an AC electrical circuit including the lighting component. In such an embodiment, the electrical line testing apparatus 12 is used to test and electrical circuit 34 directly from a lighting component to test the electrical components of the lighting component as well.

In another embodiment, the electrical line testing apparatus 12 includes additional AC adapters 33 such as for other types of lighting components such as post, pin, bay, sleeve, prong, disk base, etc. lighting components and other types of electric components, such as switches, motors, etc.

In another embodiment, the electrical line testing apparatus 12 includes additional AC adapters including an AC Wi-Fi adapter. In such an embodiment, the AC Wi-Fi adapter includes an 801.11a/801.11c adapter that generates a new Service Set IDentifier (SSID).

An SSID is a primary identifier associated with a wireless network and network devices use this identifier to identify and join a wireless network, Wireless devices like smartphones and laptops scan wireless networks broadcasting their SSIDs and presents a list of network names.

In one embodiment, the wireless interface 26 obtains the SSID from the AC Wi-Fi adapter and displays it on the display screen 24. In another embodiment, the wireless interface 26 obtains the SSID from the AC Wi-Fi component and displays it on the one or more remote wireless transceiver components 41.

When power is off on the electrical circuit 34 (i.e., a circuit breaker 36 is in the off 68 position) AC Wi-Fi adapter 33 will stop broadcasting the SSID, indicating there is no power in the circuit 34 and the display screen 24 on the apparatus 12 and/or one or more remote wireless transceiver components 41 will remove display of the SSW originally generated by the AC Wi-Fi adapter 33.

In another embodiment, the electrical line testing apparatus 12 includes DC adapters 35 for connecting the electrical line testing apparatus 12, including DC power, pin, male and female receptacle, network, RJ45-USB 35, etc. for DC electrical circuits.

In one embodiment, the DC adapter includes a DC USB Wi-Fi adapter In such an embodiment, the AC Wi-Fi adapter includes an 801.11a/801.11c adapter.

In one embodiment, the wireless interface 26 obtains the SSID from the DC Wi-Fi adapter and displays it on the display screen 24. In another embodiment, the wireless interface 26 obtains the SSID from the DC Wi-Fi component and displays it on the one or more remote wireless transceiver components 41.

When power is off on the electrical circuit 34 (i.e., a circuit breaker 36 is in the off 68 position) AC adapter 35 will stop broadcasting the SSID, indicating there is no power in the circuit 34 and the display screen 24 on the apparatus 12 and/or remote wireless transceiver components 41 will remove display of the SSID originally generated by the DC Wi-Fi adapter 35.

In one embodiment, the electrical line testing apparatus 12 includes a fault generating switch 37. The fault generating switch 37 safely generates an electrical fault on the electrical circuit 34 to intentionally trip a circuit breaker 36 connected to an electrical outlet socket 32. A user plugs the electrical line testing apparatus 12 in an electrical outlet socket 32. The user then activates the fault generating switch 37 which generates a fault on the electrical circuit 34 and trips an associated circuit breaker 36. The user goes to the circuit breaker box/panel 38 and is then able to determine which circuit breaker 36 is connected to which electrical outlet socket 32.

In one embodiment, the fault generating switch 37 includes a ground-fault circuit interrupter (GFCI), arc fault, symmetric fault, asymmetric fault, and/or ground fault switch. However, the present invention is not limited to such embodiments, and other types of fault generating switches can be used to practice the invention.

In one embodiment, the electrical line testing apparatus 12 includes a volume control switch 39 to control audible sounds from the audio component 20, 20'. In one embodiment the volume control switch 39 further includes a mute switch to immediately turn off any audible sounds generated by the apparatus 12. The volume control switch 39 is necessary in an environment where quiet is required, such as a baby nursery, hospital, etc.

In one embodiment, the electrical line testing apparatus 12 includes one or more remote wireless transceiver components 41. The one or more remote wireless transceiver components 41 include an audio component from generating audible sounds, a visual component (e.g., lights, etc.) for generating visual signals, a display component for displaying electronic information and/or application 18'. A wireless transceiver component 41 is carried by a user from electrical socket 32 including the electrical line testing apparatus 12 to a remote physical location to allow the remote wireless transceiver component 41 to be used to determine a status of the electrical circuit 34 which includes the apparatus 12.

In such an embodiment, the one or more remote wireless transceiver components 41 allow a user that does not have a smartphone 42 or other mobile network device and/or does not understand technology but desires to use the electrical line testing apparatus 12 to test an electrical circuit 34 for which a circuit breaker box/panel 38 is very remote and a very long physical distance (e.g., several hundred feet/meters up to miles/kilometers, etc.) from the electrical socket 32. In such an embodiment the electrical socket 32 is not within an audio/visual viewing/listening range of the circuit breaker box/panel 38.

The one or more remote wireless transceiver components 41 are also used when an electrical socket 32 is very remote and a very long physical distance (e.g., several hundred feet/meters up to miles/kilometers, etc.) away from a circuit breaker box/panel 38 that includes the circuit breaker 36.

In one embodiment, a remote wireless transceiver component 41 is automatically "paired" with the electrical line testing apparatus 12 via the wireless interface 26 whenever the electrical line testing apparatus 12 is placed into an electrical outlet socket 32.

In another embodiment, a remote wireless transceiver component 41 is automatically "paired" with the electrical line testing apparatus 12 via the wireless interface 26 and with an AC Wi-Fi 33 and/or DC Wi-Fi adapter 35 whenever the electrical line testing apparatus 12 is placed into an electrical outlet socket 32. However, the present invention is not limited to such an embodiment and other types of remote wireless transceiver components 41 can be used to practice the invention.

Figure 9:
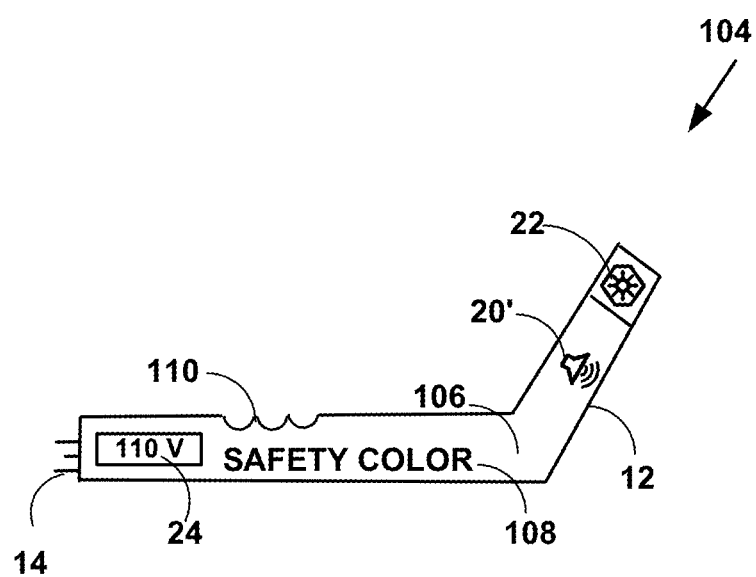
FIG. 9 is a block diagram illustrating the electrical line testing apparatus with a flexible case with a safety color.

In one embodiment, the electrical line testing apparatus 12 is placed inside a flexible case 106 (FIG. 9.) The flexible case 106 allows the electrical line testing apparatus 12 to be bent to be inserted into an electrical outlet socket 32 that is obstructed with objects such as walls, columns, machinery, etc. and still be usable and visible to a user. For example, the electrical line testing apparatus 12 in a flexible case 106 can be bent at an angle (e.g., 90 degrees, etc.) to be viewable around a corner, etc.

In one embodiment, the flexible case 106 for the electrical line testing apparatus 12 includes rubber and/or plastics, including, but not limited to, PolyVinyl Chloride (PVC) polyethylene, polypropylene, very low-density polyethylene (VLDPE), linear low-density polyethylene (LLDPE) Flexible polypropylene (FPP), Ethylene inter-polymer alloy (EIA), EPDM (ethylene propylene diene monomer), composite materials and/or other flexible materials. However, the present invention is not limited to these materials and other materials can be used to practice the invention.

Rubber refers to elastomeric compounds that comprises various monomer units forming polymers that are heat cured (i.e., vulcanized). Polymers are long molecular chains that are connected together (i.e., cross-linked) to improve their toughness and resilience. The base monomer (or monomers, when blended) is used to classify the type of rubber. For example: Neoprene, SBR or Nitrile.

Polyvinyl chloride (PVC) is durable, cheap, and easily worked into membranes. Polyvinyl chloride is produced by polymerization of a monomer, vinyl chloride (VCM). PVC's are relatively low cost, biological and chemical resistance and very workable into membranes.

Very low-density polyethylene (VLDPE) and linear low-density polyethylene (LLDPE) overcome the shortcomings of other polyethylenes (e.g., high density polyethylene (HDPE), etc. in terms of flexibility. These are less crystalline forms of polyethylene which result in increased flexibility and a membrane less conducive to brittle stress cracking.

Flexible polypropylene (FPP) is produced in both unreinforced (PPU) and reinforced (PPR) form to provide a choice in terms of tensile behavior.

Ethylene interpolymer alloy (EIA) is an alloy of PVC resin with a special ethylene interpolymer that results in a flexible plastic-free material. EIA geomembranes maintain the advantages of PVC but have a high degree of durability and chemical resistance.

EPDM (ethylene propylene diene monomer) was developed from butyl rubber and exhibits excellent elongation characteristics.

"Composite materials" are engineered or naturally occurring materials made from two or more constituent materials with significantly different physical or chemical properties which remain separate and distinct at the macroscopic or microscopic scale within the finished structure. Common polymer-based composite materials, include at least two parts, a substrate (e.g., fibers, etc.) and a resin.

The composite materials include "Fiber-reinforced polymers" (FRP) including thermoplastic composites, short fiber thermoplastics, long fiber thermoplastics or long fiber-reinforced thermoplastics. There are numerous thermoset composites, but advanced systems usually incorporate aramid fiber and carbon fiber in an epoxy resin matrix. The composite materials also include carbon/carbon composite materials with carbon fibers and a silicon carbide matrix.

However, the present invention is not limited to these materials and other materials can be used to practice the invention.

In one embodiment, the flexible case 106 for the electrical line testing apparatus 12 includes an ergonomic gripping component 110. The ergonomic gripping component 110 is designed for gripping by a human hand and allows for easy control of the electrical line testing apparatus 12.

In another embodiment, the electrical line testing apparatus 12 includes a rigid case comprising a hard plastic, composite material or other hard material. In another embodiment, the rigid case includes an ergonomic gripping component.

In one embodiment, the electrical line testing apparatus 12 includes a case with one or more selected "safety colors" 108 (FIG. 9) including but not limited to a red, yellow and/or orange safety color. An apparatus 12 used with a live electrical circuit 34 presents a danger to a user of such apparatus and to others who may encounter the apparatus during its use when plugged into an electrical outlet socket 32.

The term "safety color" is used to describe the standard use of colors for safety purposes in the workplace. Depending on the situation, each color is assigned a different meaning, which allows people to immediately determine what type of safety hazard is in the area, even if they are too far away to read any actual writing. The U.S. Occupational Safety and Health Administration (OSHA) has a number of recommendations about colors that should be used to improve safety: (1) Danger—To alert, people to a danger (which is used when there is an immediate risk), the color should be red or predominantly red. Any lettering or symbols need to be a contrasting color to ensure maximum visibility; (2) Warning—The warning category is for when there is a risk; but it is not as severe or immediate as when danger is used. The safety color associated with warning is orange or predominantly orange. As with the red, any lettering or symbols should be a contrasting color; and (3) Caution—This category is far alerting people to a potential risk, and the color used is yellow or predominantly yellow.

In one embodiment, the plural electrical probes 14 extend from apparatus 12 including a first safety color (e.g. yellow, etc.) and a case for the apparatus 12 includes a second safety color (e.g., red, orange, etc.). Various safety color and non-safety colors can be used for the apparatus 12 to practice the invention.

However, the present invention is not limited to the colors or safety colors described and other colors and safety colors can be used to practice the invention.

In one embodiment, the electrical line testing apparatus 12 further includes an attachment clip 43 for attaching the apparatus 12 to clothing, a belt, a tool box, etc.

However, the present invention is not limited to the components described for the electrical line testing apparatus 12 and more, fewer or other types of components can be used to practice the invention.

Electrical System in a Home or Business

The electrical system in a home or business comprises a line from an electrical pole, a meter where electrical usage is tallied, a main circuit breaker box/panel 38 (sometimes called "load centers" and, in older homes, fuse panels), separate wiring circuits 34 to all the rooms in the home or business, outlets, light fixture boxes. When the main electric supply line leaves the meter, it enters the home or business and arrives next at the circuit breaker box/panel 38 at the main circuit breaker.

The maximum amount of electricity that a home or business can use at one time is dictated by the size of the main circuit breaker. The main circuit breaker is also a type of switch, set to flip off in case of an overload in the home, reducing the risk of fire or electrocution. Most modern homes and businesses have 200 amp (short for amperage) service, while an older home or business might only have 100 amp service and a larger home or business a 400 amp service.

Below the main breaker, electric service is divided up by smaller circuit breakers 36 which govern an amount of electricity available to each electrical circuit 34. These circuits 34 usually represent individual electrical sockets 32, but may also represent hard-wired appliances like air-conditioners, furnaces, water heaters, etc. So, for example, of the 200 amps available to a home, a kitchen may have two 20 amp circuits, a bedroom may have four 15 amp circuits, an air-conditioner a 30 amp circuit, and so on. These circuit breakers 36 work much the same as the main breaker—if an electrical overload occurs, the circuit breaker 36 automatically shuts off the electricity to the circuit, reducing the chance of fire.

From the smaller circuit breakers 36, bundles of wires in separate circuits 34, run through walls, ceilings, and floors to each room and directly to hard-wired appliance. Each bundle of wire has at least three wires within—two with plastic insulation and one bare. The black and/or red insulated wires 14 are the "hot" wires coming directly off of the circuit breakers 36. The white insulated or "neutral" wire 14' carries the current back to the electrical source at the circuit breaker box/panel 38. The bare copper wire is the ground wire 14″, which is the safety part of the circuit 34. The two wires insulated wires are attached to outlets 32 or switches so that when nothing is plugged in or a switch is in the off position, the wires do not meet. When something is plugged into an outlet 32 or a switch turned on, a circuit 34 is completed, allowing electricity to flow through a light or appliance or other electrical device to activate it.

The ground wire 14″ is literally a direct path to the ground outside the home or business which acts with the circuit breaker 36, in the event of a "short circuit." It is attached to all metal parts of a fixture or appliance. If a faulty appliance, frayed wire, or wet conditions give electricity a separate, less resistant path to the ground, the ground wire acts as a path of least resistance, allowing the excess electricity to travel directly to the ground and triggering the circuit breaker 36 to shut off, helping avoid electrocution or fire.

While standard circuits 34 to plugs and outlets 32 are usually 110 volts, some larger hard-wired and plug-in appliances, like electric ovens, ranges, and clothes dryers, are 220 volt.

Electrical Line Testing

Figure 4:
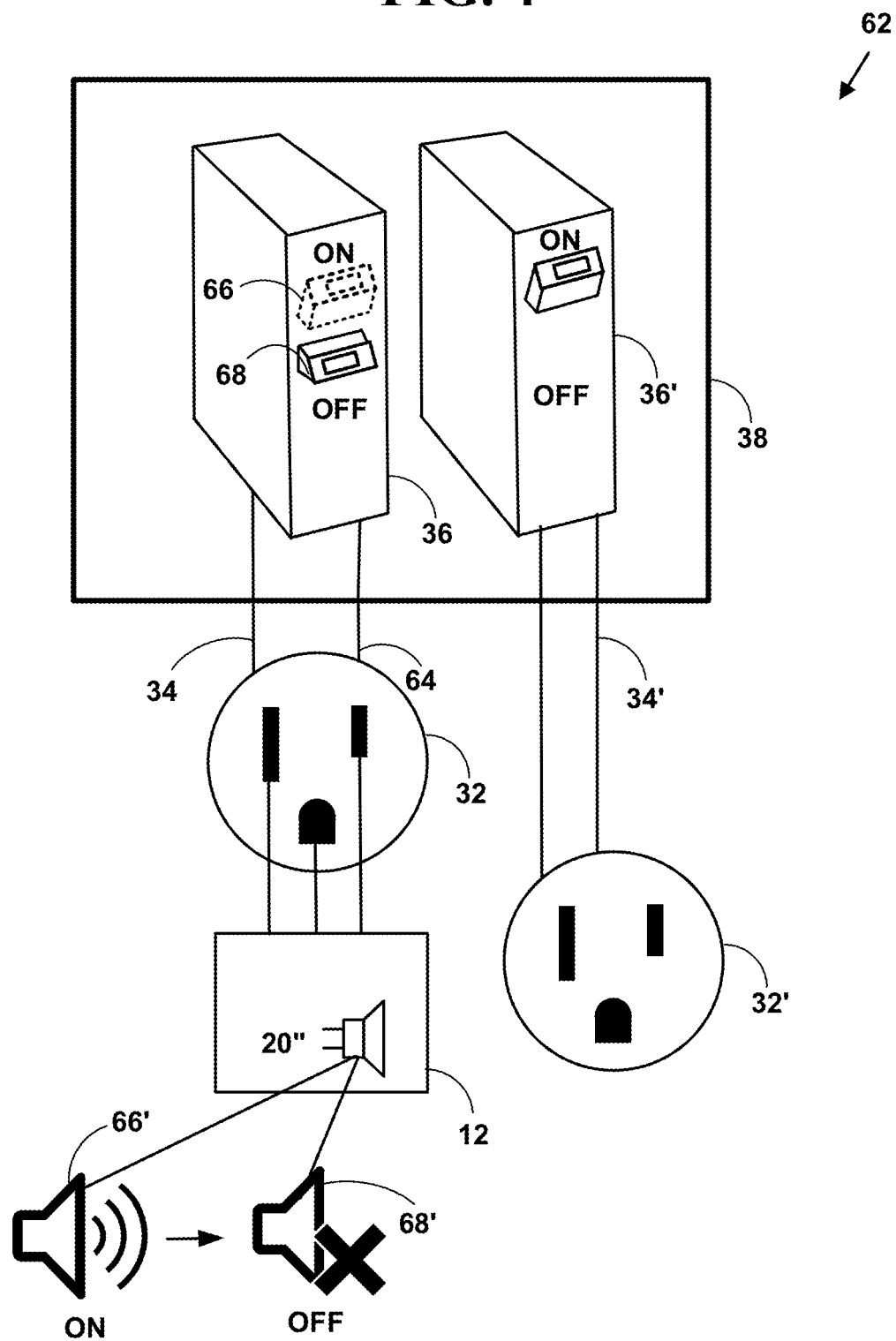
FIG. 4 is a block diagram illustrating use of an electrical line testing apparatus.

FIG. 4 is a block diagram illustrating use of the electrical line testing apparatus 12. When apparatus 12 is plugged into an electrical socket 32, a circuit 34 is completed, allowing electricity to flow through the apparatus 12 to activate it. When apparatus 12 is plugged into electrical socket 32 and the associated circuit breaker 36 is set to the "ON" position, the audio component 20′ of the apparatus 12 sends out a desired audio sound 66. The one or more visual components 22 of the apparatus 12 may also be turned on and emit light and/or colored light.

In one embodiment, only the audio component 20 of the apparatus 12 is activated when the apparatus 12 is plugged into the electrical socket 32. In another embodiment, only the one or more visual components 22 of the apparatus 12 is activated when the apparatus 12 is plugged into the electrical socket 32. In another embodiment, both the audio component 20 and the one or more visual components 22 of the apparatus 12 are activated when the apparatus 12 is plugged into the electrical socket 32.

In another embodiment, the display screen 24 of the apparatus 12 includes informational messages about the status of the electrical circuit 34 (e.g., ON, OFF, CURRENT, NO CURRENT, 120 VOLTS, zero VOLTS, SSID=xxxxx, etc.) when the apparatus 12 is plugged into the electrical socket 32 and when the and the associated circuit breaker 36 changes between the ON/OFF states.

In one embodiment, only the display screen 24 and the audio component 20 of the apparatus 12 are activated when the apparatus 12 is plugged into the electrical socket 32. In another embodiment, only the display screen 24 and the one or more visual components 22 of the apparatus 12 are activated when the apparatus 12 is plugged into the electrical socket 32. In another embodiment, the display screen 24, the audio component 20 and the one or more visuals components 22 of the apparatus 12 are all activated when the apparatus 12 is plugged into the electrical socket 32.

When the circuit breaker is set to the "OFF" position, the audio component 20′ of the apparatus 12 stops sending out the desired audio sound 68, the one or more visual components 22 stop emitting light and/or the display screen 24 changes state and displays different electronic information.

This behavior of the apparatus 12 when a circuit breaker 36, 36′ is toggled between ON/OFF states, allows a user to determine which electrical socket 32, 32′ is connected to which circuit 34, 34′ and to which circuit breaker 36, 36′ in the circuit breaker box/panel 38.

In a house, a breaker box/panel 38 may be located in a basement and/or other remote part of the house. To determine which electrical socket 32 is associated with which circuit breaker 36 is often a difficult task as plural sockets 32 may be associated with a single circuit breaker 36. The apparatus 12 allows a user to use, sound, and/or light and/or electronic information displayed by apparatus 12 to determine which electrical sockets 32 are associated with which circuit breaker 36 even though the electrical socket 32 may be at a first location and the circuit breaker 36 and the circuit breaker box/panel 38 may be at another second locate remote to the first location (e.g., on another floor, in another room, in another part of the home such as a garage, attic, etc.)

FIGS. 5A and 5B are a flow diagram illustrating a Method 70 for electrical line testing with an electrical line testing apparatus 12.

In FIG. 5A at Step 72, an electrical line testing apparatus is connected to an electrical socket that is connected to an electrical circuit including a circuit breaker with an on-off switch component, thereby allowing electricity to flow through the electrical circuit. At Step 74, a first input signal is received on a control circuit on the electrical line testing apparatus, the first input signal including a request to activate one or more audio components, visual components and/or display components on the electrical line testing apparatus to indicate with a first indication that electricity is flowing through the electrical circuit. At Step 76, a first output signal is sent from the control circuit on the electrical line testing apparatus activating the one or more audio components, visual components and/or display components on the electrical line testing apparatus, thereby indicating with the first indication that electricity is flowing through the electrical circuit. At Step 78, a second input signal is received on the control circuit on the electrical line testing apparatus disconnecting the electrical circuit through the electrical line testing apparatus, wherein the second input signal is generated by the switch component on a circuit breaker connected to the electrical circuit being switched from an on-position to an off-position. In FIG. 5B at Step 80, a second output signal is sent from the control circuit on the electrical line testing apparatus deactivating the one or more audio components, visual components and/or display components on the electrical line testing apparatus, thereby providing a second indication with audio, visual and/or electronic information indication that the circuit breaker connected to the electrical circuit controls a flow of electricity through the electrical socket and that the circuit breaker has turned the flow of electricity to the electrical socket off.

Method 70 is illustrated with an illustrative embodiment. However, the present invention is not limited to this illustrative embodiment and other embodiments can be used to practice the invention.

In such an illustrative embodiment in FIG. 5A at Step 72, an electrical line testing apparatus 12 is connected to an electrical socket 32 that is connected to an electrical circuit 34 including a circuit breaker 36 comprising an on-off switch component, thereby allowing electricity to flow through the electrical circuit 34.

In one embodiment the electrical circuit 34 is an AC circuit. In another embodiment, the electrical circuit is a DC circuit. The DC circuit includes communication network 40 related DC circuits.

At Step 74, a first input signal is received on a control circuit 16 on the electrical line testing apparatus 12, the first input signal including a request to activate one or more audio components 20, visual components 22 and/or display components 24 on the electrical line testing apparatus 12 to indicate with a first indication (e.g., sound, light, etc.) electricity is flowing through the electrical circuit 34.

At Step 76, a first output signal is sent from the control circuit 16 on the electrical line testing apparatus 12 activating the audio component 20, visual component 22 and/or the display component 24 on the electrical line testing apparatus 12, thereby indicating with the first indication that electricity is flowing through the electrical circuit 34.

At Step 78, a second input signal is received on the control circuit 16 on the electrical line testing apparatus 12 disconnecting the electrical circuit 34 through the electrical line testing apparatus 12, wherein the second input signal is generated by the switch component on a circuit breaker 36 connected to the electrical circuit 23 being switched from an "on-position" 66 (FIG. 4) to an "off-position" 68.

In FIG. 5B at Step 80, a second output signal is sent from the control circuit 16 on the electrical line testing apparatus 12 deactivating the one or more audio components 20, visual components 22 and/or display components 24 on the electrical line testing apparatus 12, thereby providing a second indication (e.g., no sound, no light, etc.) of audio, visual and/or electronic information that the circuit breaker 36 connected to the electrical circuit 34 controls a flow of electricity through the electrical socket 43 and that the circuit breaker 36 has turned the flow of electricity to the electrical socket 32 off.

Method 70 allows a user to correctly determine which electrical socket 32 is connected to which circuit breaker 36 with audio, visual and/or electronic display information, even when the electrical socket 32 is remote and a short physical distance away from a circuit breaker box/panel 38 that includes the circuit breaker 36.

For example, a user inserts apparatus 12 into an electrical socket 32 on a first floor of a home and apparatus 12 emits a loud sound through audio component 22. The user proceeds to a basement level in the home which includes the circuit breaker box/panel 38 and turns various circuit breakers 36, 36' on and off until the loud sound stops. When the loud sound stops, the user has determined which circuit breaker 36 is connected to the electrical socket 32 including the apparatus 12.

In another example, a user inserts apparatus 12 into an electrical socket 32 on a first floor of a home and apparatus 12 activates visual component 22 which includes a strobe light. The user proceeds to a hallway in the home which includes the circuit break box/panel 38. The strobe light from the apparatus 12 is visible from the hallway. The user turns various circuit breakers 36, 36' on and off until the strobe light stops. When the strobe light stops, the user has determined which circuit breaker 36 is connected to the electrical socket 32 including the apparatus 12.

In this situation the electrical line testing apparatus 12 may be used in a residential home or a small business when a circuit breaker box/panel 38 is down a hall, in another room, in a basement, attic, etc. from a location for a desired electrical socket. In this situation, the user is close enough to the electrical line testing apparatus 12 so the user can hear sounds generated by the audio component 20 and/or see visual light generated by the visual component 22.

Figure 6B:
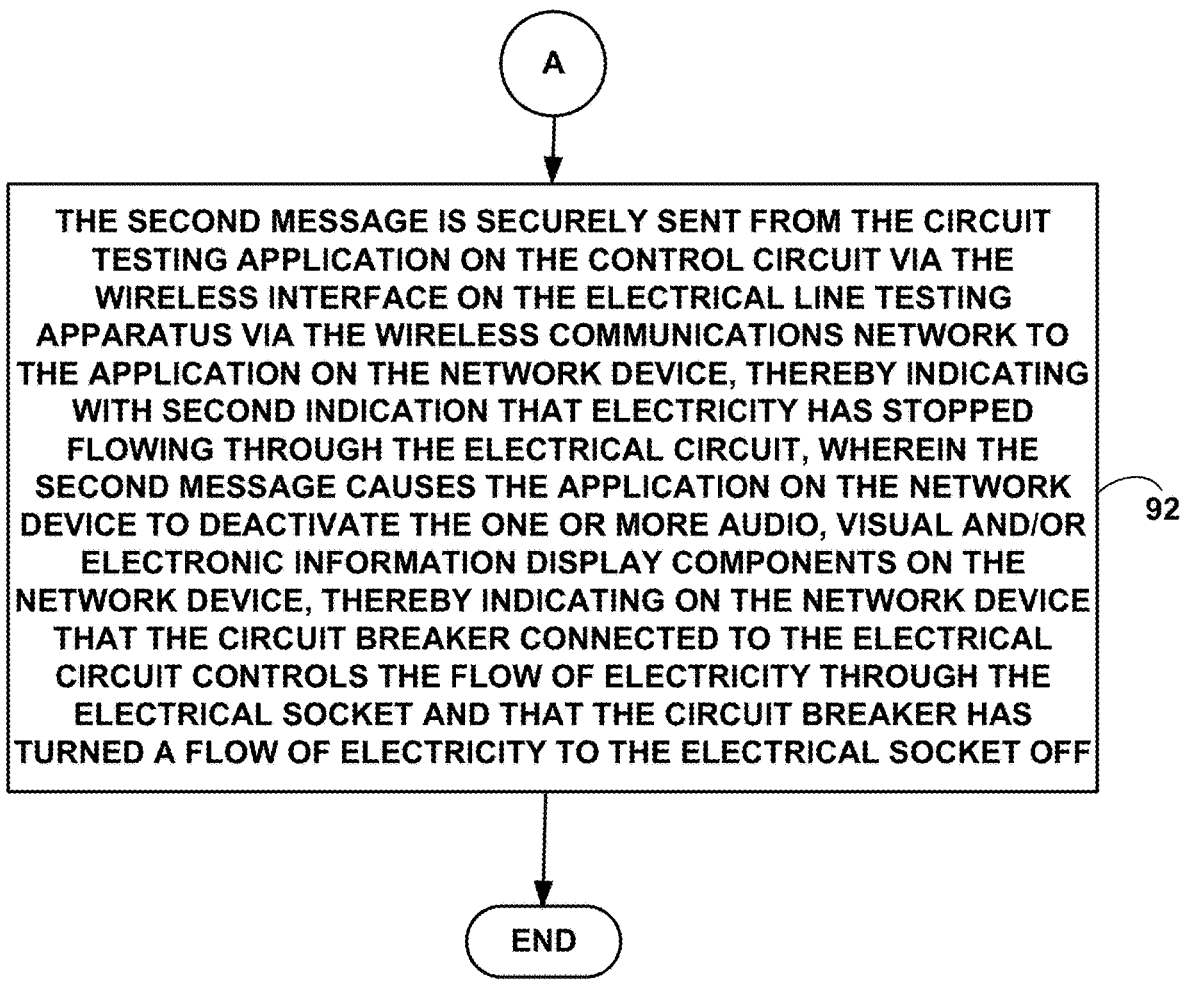

FIGS. 6A and 6B are a flow diagram illustrating a Method 82 for electrical line testing with an electrical line testing apparatus 12.

Figure 7:
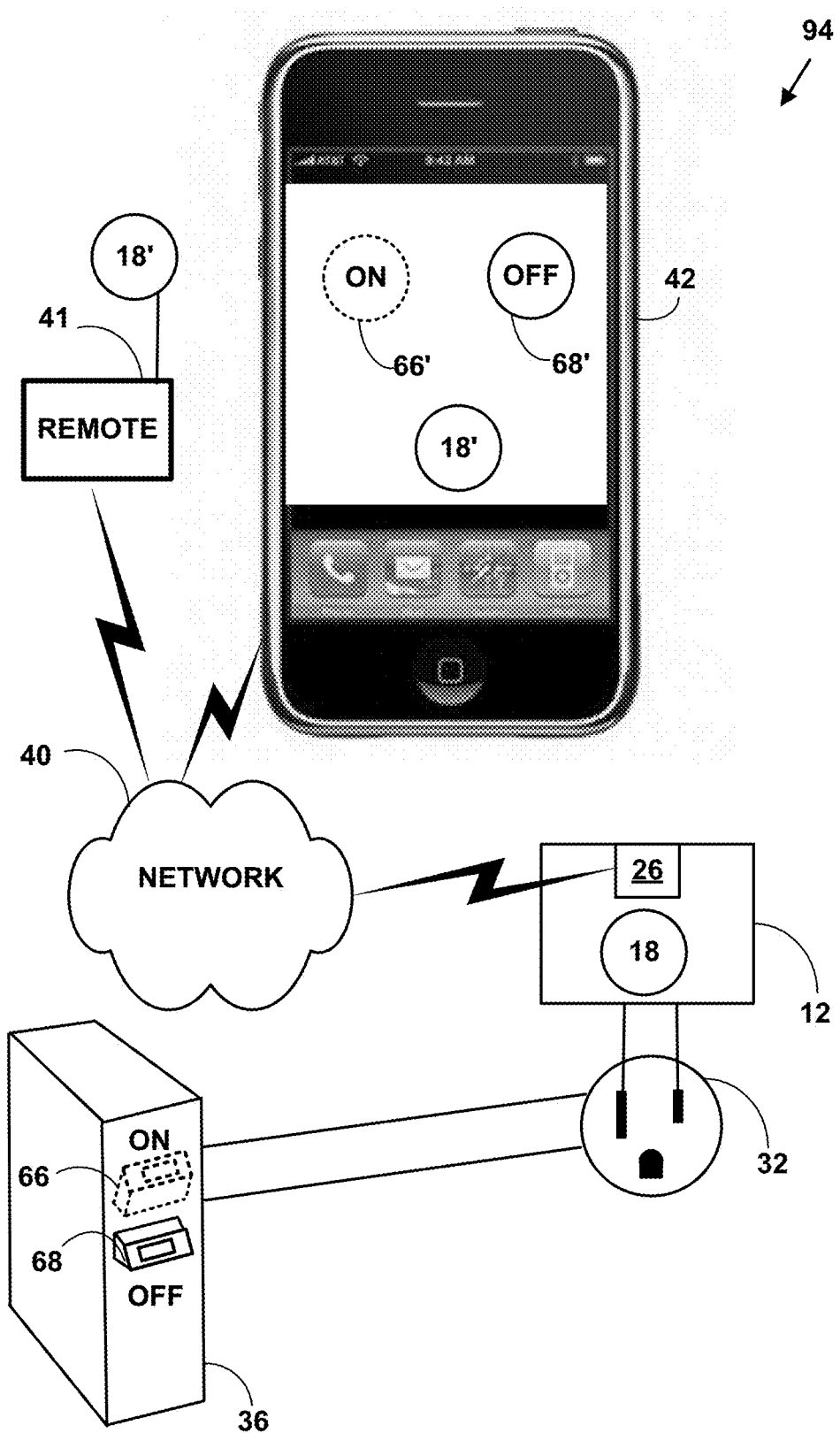
FIG. 7 is a block diagram graphically illustrating components of the method of FIG. 6.

FIG. 7 is a block diagram 94 graphically illustrating components of the method of FIG. 6.

In FIG. 6A at Step 84, an electrical line testing apparatus is connected to an electrical socket that is connected to an electrical circuit including a circuit breaker with an on-off switch component, thereby allowing electricity to flow through the electrical circuit. At Step 86, a first input signal is received on a circuit testing application on a control circuit on the electrical line testing apparatus, the first input signal including a request to send a first message to an application on a network device with one or more processors to indicate that electricity is flowing through the electrical circuit. At Step 88, the first message is securely sent from the circuit testing application on the control circuit via a wireless interface on the electrical line testing apparatus via a wireless communications network to the application on the network device, thereby indicating with a first indication that electricity is flowing through the electrical circuit. The first message causes the application on the network device to activate one or more audio, visual and/or electronic information display components on the network device. At Step 90, a second input signal is received on the control circuit on the electrical line testing apparatus disconnecting the electrical circuit through the electrical line testing apparatus. The second input signal is generated by the switch component on a circuit breaker connected to the electrical circuit being switched from an on-position to an off-position. In FIG. 6B at Step 92, the second message is securely sent from the circuit testing application on the control circuit via the wireless interface on the electrical line testing apparatus via the wireless communications network to the application on the network device, thereby indicating with second indication that electricity has stopped flowing through the electrical circuit. The second message causes the application on the network device to deactivate the one or more audio, visual and/or electronic information display components on the network device, thereby indicating on the network device that the circuit breaker connected to the electrical circuit controls the flow of electricity through the electrical socket and that the circuit breaker has turned a flow of electricity to the electrical socket off.

Method 82 is illustrated with an illustrative embodiment. However, the present invention is not limited to this illustrative embodiment and other embodiments can be used to practice the invention.

In such an illustrative embodiment at FIG. 6A at Step 84, an electrical line testing apparatus 12 is connected to an electrical socket 32 that is connected to an electrical circuit 34 including a circuit breaker 36 with an on-off switch component, thereby allowing electricity to flow through the electrical circuit 34.

In one embodiment the electrical circuit 34 is an AC circuit. In another embodiment, the electrical circuit is a DC circuit. The DC circuit includes communication network 40 related DC circuits.

In one embodiment, Step 84 further includes further connecting electrical line testing apparatus 12 to a communications network 40 with a cable via the wired interface 26'.

At Step 86, a first input signal is received on a circuit testing application 18 on a control circuit 16 on the electrical line testing apparatus 12, the first input signal including a request a first message be sent to an application 18' on a network device 42, 46, 48, 50, 54, 56, 58, 60 with one or more processors and/or one or more remote wireless transceiver components 41 to indicate that electricity is flowing through the electrical circuit 34.

At Step 88, the first message is securely sent from the circuit testing application 18 on the control circuit 16 via a wireless interface 26 on the electrical line testing apparatus via a wireless communications network 40 to the application 18' on the network device 42, 46, 48, 50, 54, 56, 58, 60 and/or one or more remote wireless transceiver components 41, thereby indicating with a first indication that electricity is flowing through the electrical circuit 34.

In another embodiment, the first message is securely sent from the circuit testing application 18 on the control circuit 16 via a wired interface 26' on the electrical line testing apparatus via a communications network 40 to the application 18' on the network device 42, 46, 48, 50, 54, 56, 58, 60, thereby indicating with the first indication that electricity is flowing through the electrical circuit 34.

In such an embodiment, the network device 42, 46, 48, 50, 54, 56, 58, 60, is connected to the wired communications network 40 with a cable.

In another embodiment, another component on the communications network 40, including a wireless access points sends message to the network device 42, 46, 48, 50, 54, 56, 58, 60 and/or one or more remote wireless transceiver components 41 via a wireless interface on the network device 42, 46, 48, 50, 54, 56, 58, 60.

The first message causes the application 18' on the network device 42, 46, 48, 50, 54, 56, 58, 60 and/or one or more remote wireless transceiver components 41 to activate one or more audio components, (e.g. sound, buzzer, etc.), visual components (e.g., light, graphics, electronic text, camera, etc.) and/or electronic information (e.g., text, graphical, etc.) display components on the network device 42, 46, 48, 50, 54, 56, 58, 60 and/or one or more remote wireless transceiver components 41. For example, the first message may cause a display on a display component on a wearable device such as a watch 48, wearable digital glass 50, etc. or a mobile network device such as a smart phone 42, etc. (FIG. 7).

The first message is securely sent using any of the security and/or encryption methods described herein to prevent tampering and help ensure electrical safety for the user. In another embodiment, the first message is not sent securely.

In one embodiment, first message is an SMS message, instant message, and/or voice message. However, the present invention is not limited to the messages described and more, fewer and/or other messages can be used to practice the invention.

At Step 90, a second input signal is received on the control circuit 16 on the electrical line testing apparatus 12 disconnecting the electrical circuit 34 through the electrical line testing apparatus 12. The second input signal is generated by the switch component on a circuit breaker 36 connected to the electrical circuit 34 being switched from an on-position 66 to an off-position 68.

In FIG. 6B at Step 92, the second message is securely sent from the circuit testing application 18 on the control circuit 18 via the wireless interface 26 on the electrical line testing apparatus 12 via the wireless communications network 40 to the application 18' on the network device 42, 46, 48, 50, 54, 56, 58, 60 one or more remote wireless transceiver components 41, thereby indicating with second indication that electricity has stopped flowing through the electrical circuit 34.

In another embodiment, the second message is securely sent from the circuit testing application 18 on the control circuit 16 via a wired interface 26' on the electrical line testing apparatus via a communications network 40 to the application 18' on the network device 42, 46, 48, 50, 54, 56, 58, 60 one or more remote wireless transceiver components 41 thereby indicating with the second indication that electricity is flowing through the electrical circuit 34.

In such an embodiment, the network device 42, 46, 48, 50, 54, 56, 58, 60, is connected to the wired communications network 40 with a cable.

In another embodiment, another component on the communications network 40, including a wireless access points sends message to the network device 42, 46, 48, 50, 54, 56, 58, 60 and/or one or more remote wireless transceiver components 41, via a wireless interface on the network device 42, 46, 48, 50, 54, 56, 58, 60 and/or one or more remote wireless transceiver components 41.

The second message causes the application 18' on the network device 42, 46, 48, 50, 54, 56, 58, 60 and/or one or more remote wireless transceiver components 41 to deactivate the one or more audio, visual and/or electronic information display components on the network device 42, 46, 48, 50, 54, 56, 58, 60 and/or one or more remote wireless transceiver components 41, thereby indicating on the network device 42, 46, 48, 50, 54, 56, 58, 60 and/or one or more remote wireless transceiver components 41 that the circuit breaker 36 connected to the electrical circuit 34 controls the flow of electricity through the electrical socket 34 and that the circuit breaker 36 has turned a flow of electricity to the electrical socket 32 off. The second message is securely sent using any of the security and/or encryption methods described herein to prevent tampering and help ensure electrical safety for the user. In another embodiment, the second message is not sent securely.

In one embodiment, second message is an SMS message, instant message, and/or voice message. However, the present invention is not limited to the messages described and more, fewer and/or other messages can be used to practice the invention.

Method 82 allows a user to correctly determine which electrical socket 32 is connected to which circuit breaker 36 with audio, visual and/or electronic display information, even when the electrical socket 32 is very remote and a very long physical distance (e.g., several hundred feet/meters up to miles/kilometers, etc.) away from a circuit breaker box/panel 38 that includes the circuit breaker 36 and is not within an audio/visual viewing/listening range of the electrical line testing apparatus 12.

For example, in this situation the electrical line testing apparatus 12 may be used in a large warehouse, factory, manufacturing, plant, etc. comprising one or more large commercial buildings. In such a situation, the large commercial building may include too much noise to hear the audio components 20 on the electrical line testing apparatus 12 and/or have lighting (e.g., too much and/or too little light, etc.) that is appropriate for seeing any of the one or more visual components 22 and/or display screen 24 on the electrical line testing apparatus 12 from a short and/or a long distance away from the circuit breaker box/panel 38. Thus, the electrical line testing apparatus 12 is used with an external network device 42, 46, 48, 50, 54, 56, 58, 60 and/or the one or more remote wireless transceiver components 41 that is carried by a user to the circuit breaker box/panel 38 after the user plugs the electrical line testing apparatus 12 into the desired electrical socket 32.

The electrical line testing apparatus 12 may also be used with transportation vehicles such boats, ships, trains, aircraft, spacecraft, etc. whose electrical sockets 32 are close to and/or remote from circuit breaker box/panel 38. It may also be used on other vehicles such as cars, trucks, motorcycles, snowmobiles with specialized adapters include On-Board Diagnostics (ODB) and other adapters.

The electrical line testing apparatus 12 is not limited to any frequency or voltage type of circuit and may be used with 120 volt, 240 volt, 50 Hz, 60 Hz, single phase and triple phase electronic circuits.

Figure 8:
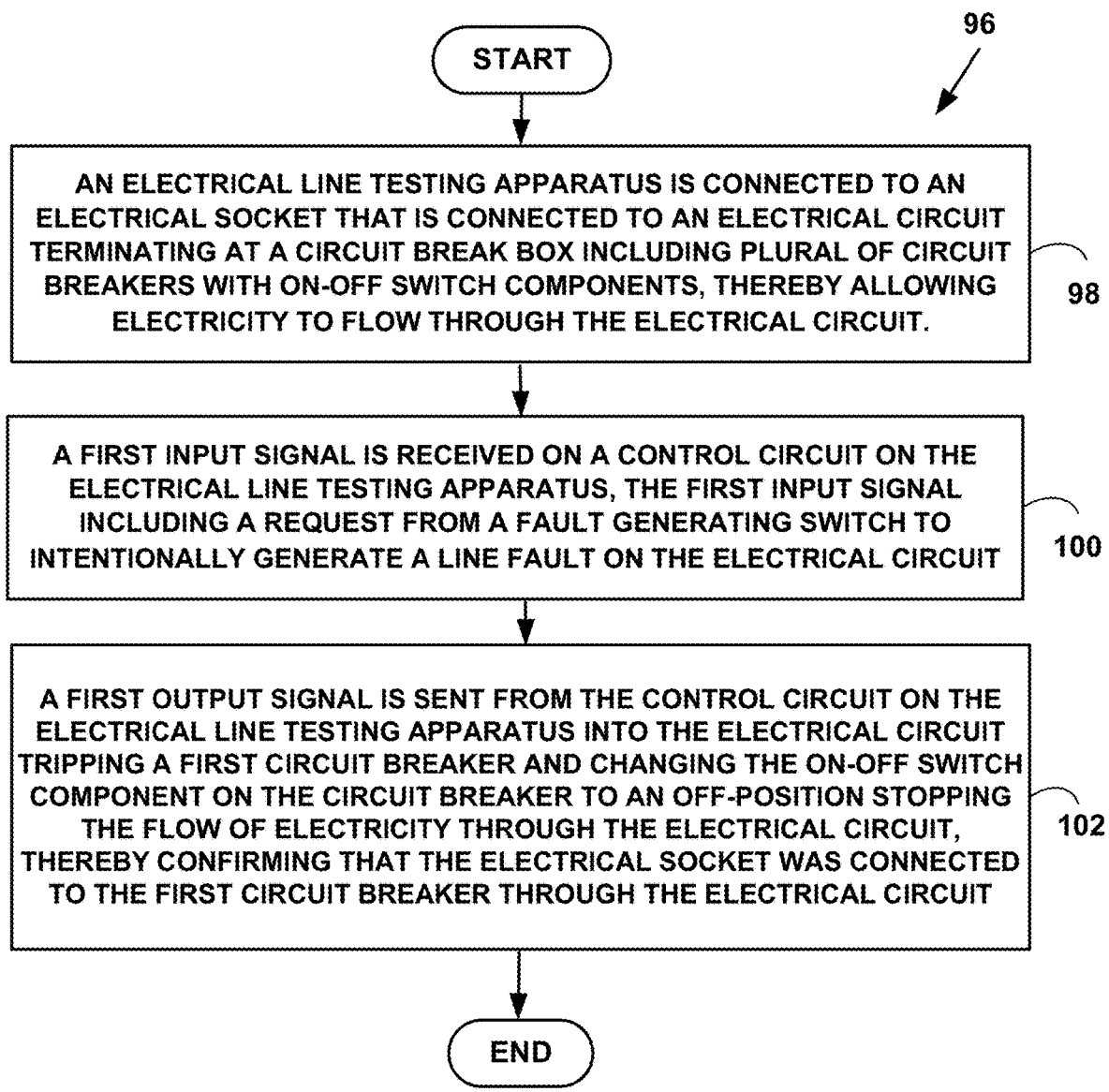
FIG. 8 is a flow diagram illustrating a method for electrical line testing with an electrical line testing apparatus.

FIG. 8 is a flow diagram illustrating a Method 96 for electrical line testing with an electrical line testing apparatus 12. A at Step 98, an electrical line testing apparatus is connected to an electrical socket that is connected to an electrical circuit terminating at a circuit break box including plural of circuit breakers with on-off switch components, thereby allowing electricity to flow through the electrical circuit. At Step 100, a first input signal is received on a control circuit on the electrical line testing apparatus, the first input signal including a request from a fault generating switch to intentionally generate a line fault on the electrical circuit. At Step 102, a first output signal is sent from the control circuit on the electrical line testing apparatus into the electrical circuit tripping a first circuit breaker and changing the on-off switch component on the circuit breaker to an off-position stopping the flow of electricity through the electrical circuit, thereby confirming that the electrical socket was connected to the first circuit breaker through the electrical circuit.

Method 96 is illustrated with an illustrative embodiment. However, the present invention is not limited to this illustrative embodiment and other embodiments can be used to practice the invention.

In such an illustrative embodiment, in FIG. 8 at Step 98, an electrical line testing apparatus 12 is connected to an electrical socket 32 that is connected to an electrical circuit 34 terminating at a circuit break box/panel 38 including plural of circuit breakers 36, 36' with on-off switch components, thereby allowing electricity to flow through the electrical circuit 34.

At Step 100, a first input signal is received on a control circuit 16 on the electrical line testing apparatus 12, the first input signal including a request from a fault generating switch 37 to intentionally generate a line fault on the electrical circuit 34.

At Step 102, a first output signal is sent from the control circuit 16 on the electrical line testing apparatus 12 into the electrical circuit 34 tripping a first circuit breaker 36 and changing the on-off switch component on the circuit breaker to an off-position stopping the flow of electricity through the electrical circuit 12, thereby confirming that the electrical socket 32 was connected to the first circuit breaker 36 through the electrical circuit 34.

Method 96 allows a user to correctly determine which electrical socket 32, 32' is connected to which circuit breaker 36, 36' in a circuit breaker box/panel 38 that includes plural circuit breakers 36, 36'. The user generates a line fault with the fault generating switch 37 on the electrical line testing apparatus 12. The line fault trips the first circuit breaker 36 in the circuit breaker box/panel 38. Thus, the user is able to determine the first circuit breaker 36 is connected to the electrical socket 32. This method allows the electrical line testing apparatus 12 to be used in any environment no matter what the distance between the electrical socket and the circuit breaker box/panel 38 is.

FIG. 9 is a block diagram 104 illustrating the electrical line testing apparatus 12 with a flexible case 106 with a safety color 108.

The method and apparatus described herein provides audio, visual and/or electronic information to indicate electricity is flowing or not flowing through an electrical circuit controlled by a remote circuit breaker or fuse. The method and system help identify which electrical sockets are controlled by the remote circuit breakers. The method and system is used over short distances in a residential home or over long distances in a commercial building such as a warehouse or factory. The method and apparatus is used with or without an external network devices such as a smartphone, electronic tablet, wearable device, etc.

It should be understood that the architecture, programs, processes, methods and systems described herein are not related or limited to any particular type of computer or network system (hardware or software), unless indicated otherwise. Various types of general purpose or specialized computer systems may be used with or perform operations in accordance with the teachings described herein.

In view of the wide variety of embodiments to which the principles of the present invention can be applied, it should be understood that the illustrated embodiments are exemplary only, and should not be taken as limiting the scope of the present invention. For example, the steps of the flow diagrams may be taken in sequences other than those described, and more or fewer elements may be used in the block diagrams.

While various elements of the preferred embodiments have been described as being implemented in software, in other embodiments hardware or firmware implementations may alternatively be used, and vice-versa.

The claims should not be read as limited to the described order or elements unless stated to that effect. In addition, use of the term "means" in any claim is intended to invoke 35 U.S.C. § 112, paragraph 6, and any claim without the word "means" is not so intended. Therefore, all embodiments that come within the scope and spirit of the following claims and equivalents thereto are claimed as the invention.

I claim:

1. An electrical line testing apparatus, comprising in combination:
    a plurality electrical probes for connecting the electrical line testing apparatus to an alternating current (AC) source via an electrical socket;
    a control circuit for controlling operations and other components of the electrical line testing apparatus;
    a circuit testing application executing in a non-transitory computer readable medium in the control circuit, for communicating with an application on an external network device with one or processors via a communications network, and for indicating that the electrical line testing apparatus is connected to an electrical circuit in which an electrical current is flowing or not flowing;
    one or more audio components for indicating with an audible sound that the electrical line testing apparatus is connected to an electrical circuit in which an electrical current is flowing;
    one or more visual components for indicating with one or more light sources that electrical line testing apparatus is connected to an electrical circuit in which the electrical current is flowing;
    a display screen for indicating the electronic line testing apparatus is connected to an electrical circuit in which the electrical current is flowing or not flowing;
    a wireless interface connecting the electrical line testing to the communications network and the network device;
    a direct current (DC) connection testing component for connecting the electrical line testing apparatus to a DC circuit in which a DC current is flowing;

one or more DC connectors for connecting the DC connection testing component to the DC circuit in which the DC current is flowing;

a fault switch for intentionally generating an arc fault for a single phase electrical circuit and a symmetric fault or an asymmetric fault for a three phase electrical circuit, on the electrical circuit to stop the flow of the electrical current in the electrical circuit and cause an on-off switch on a circuit breaker connected to the electrical circuit to change from an onposition to an off-position; and a flexible case enclosing the control circuit, circuit testing application, one or more audio components, one or more visual components, display screen, wireless interface, direct current (DC) connection testing component and the fault switch of the electrical line testing apparatus, comprising one or more safety colors, the flexible case bendable at an angle up to ninety degrees for viewing the electrical line testing apparatus around an obstruction and including an ergonomic gripping component with a plurality of indentations for safely grasping the flexible case and safely controlling use of the electrical line testing apparatus.

2. The electrical line testing apparatus of claim 1 wherein the one or more audio components include a speaker, buzzer or bell.

3. The electrical line testing apparatus of claim 1 wherein the one or more visual components include one or more incandescent light bulb components, one or more High-Intensity Discharge (HID) bulb components, one or more light emitting diode (LED) components or one or more strobe light components.

4. The electrical line testing apparatus of claim 1 wherein display screen includes a Liquid Crystal Display (LCD) screen.

5. The electrical line testing apparatus of claim 1 wherein the wireless interface includes a cellular telephone, Short Message Service (SMS), instant message, IEEE 802.11a, 802.11ac, 802.11b, 802.11g, 802.11n, Wireless Fidelity (Wi-Fi), Wi-Fi Aware, Worldwide Interoperability for Microwave Access (WiMAX), ETSI High Performance Radio Metropolitan Area Network (HIPERMAN), RF Home, Zigbee, Z-wave, Bluetooth, Infrared, Industrial, Scientific and Medical (ISM), Radio Frequency Identifier (RFID), Near field communication (NFC) or Machine-2-Machine ("M2M") wireless interface.

6. The electrical line testing apparatus of claim 1 wherein the one or more DC connectors include a RJ-11, RJ-45, male-female receptacle, metal clips, or USB connectors.

7. The electrical line testing apparatus of claim 1 further comprising:
a wired interface for connecting the electrical line testing apparatus to a communications network.

8. The electrical line testing apparatus of claim 7 wherein the wired interface includes a twisted pair of copper wires, digital subscriber lines, coaxial cable or fiber optic cable, wired interface.

9. The electrical line testing apparatus of claim 1 further comprising:
one or more electrical adapters for connecting the electrical line testing apparatus to one or more other electrical components.

10. The electrical line testing apparatus of claim 9 wherein the one or more electrical adapters include a screw socket, post, pin, bay, sleeve, prong or disk base adapters for lighting electrical components and one or more electrical adapters for motor or switch electrical components.

11. The electrical line testing apparatus of claim 9 wherein the one or more electrical adapters for connecting the electrical line testing apparatus to one or more other electrical components include an Alternating Current (AC) or Direct Current (DC) electrical line testing adapter.

12. The electrical line testing apparatus of claim 1 further comprising:
a remote wireless transceiver receiver with an audio component, visual component, a wireless interface and one or more processors that is paired with the electrical line testing apparatus for connecting the electrical line testing apparatus to the remote wireless transceiver via the communications network for use over long physical distances.

13. The electrical line testing apparatus of claim 1 wherein the communications network includes a wireless communication network or a wired communication network or a combination thereof.

14. The electrical line testing apparatus of claim 1 further including:
the external network device including the with one or more processors and the an application for communicating with the electrical line testing apparatus via the a communications network for indicating on the application on the external network device that the electrical line testing apparatus at a location remote to the external network device is connected to a selected electrical circuit in which a selected electrical current is flowing or not flowing.

15. The electrical line testing apparatus of claim 14 wherein the network device includes a smart phone, computer, wearable network device or electronic tablet.

16. The electrical line testing apparatus of claim 1 wherein the electrical circuit includes the electrical circuit located in a building or on a vehicle, boat, ship, train, aircraft, or spacecraft.

17. An electrical line testing apparatus, comprising in combination:
a plurality electrical probes for connecting the electrical line testing apparatus to an alternating current (AC) source via an electrical socket;

a control circuit for controlling operations and other components of the electrical line testing apparatus;

a circuit testing application executing in a non-transitory computer readable medium in the control circuit for indicating that the electrical line testing apparatus is connected to an electrical circuit in which an electrical current is flowing or not flowing;

one or more audio components for indicating with an audible sound that the electrical line testing apparatus is connected to an electrical circuit in which an electrical current is flowing;

one or more visual components for indicating with one or more light sources that electrical line testing apparatus is connected to an electrical circuit in which the electrical current is flowing;

a display component for indicating the electronic line testing apparatus is connected to an electrical circuit in which the electrical current is flowing or not flowing;

a direct current (DC) connection testing component for connecting the electrical line testing apparatus to a DC circuit in which a DC current is flowing;

one or more DC connectors for connecting the DC connection testing component to the DC circuit in which the DC current is flowing; and a flexible case enclosing the control circuit, circuit testing application, one or more audio components, one or more visual components, display component, and direct current (DC) connection testing component of the electrical line testing apparatus, comprising one or more safety colors, the flexible case bendable at an angle up to ninety degrees for viewing the electrical line testing apparatus around an obstruction and including an ergonomic gripping component with a plurality of indentations for safely grasping the flexible case and safely controlling use of the electrical line testing apparatus.

* * * * *